United States Patent

Noma et al.

[11] Patent Number: 6,144,139
[45] Date of Patent: Nov. 7, 2000

[54] PIEZOELECTRIC TRANSFORMER INVERTER

[75] Inventors: Takashi Noma, Nagaokakyo; Yasuyuki Morishima, Kyotanabe; Hidehiko Sugimoto, Kasugai, all of Japan

[73] Assignee: Murata Manufacturing Co., Ltd., Japan

[21] Appl. No.: 09/409,807

[22] Filed: Sep. 30, 1999

[30] Foreign Application Priority Data

Oct. 5, 1998 [JP] Japan .................................. 10-283075

[51] Int. Cl.⁷ ................................................ H01L 41/08
[52] U.S. Cl. ........................................................ 310/316.01
[58] Field of Search ............................. 310/316.01, 358, 310/359, 366; 315/204 R, 204 PZ; 363/97, 133

[56] References Cited

U.S. PATENT DOCUMENTS

| | | | |
|---|---|---|---|
| 5,705,879 | 1/1998 | Abe et al. ....................... | 310/316.01 X |
| 5,731,652 | 3/1998 | Shimada ............................. | 310/316.01 |
| 5,739,622 | 4/1998 | Zaitsu ................................ | 310/316.01 |
| 5,796,213 | 8/1998 | Kawasaki ....................... | 310/316.01 X |
| 5,894,184 | 4/1999 | Furuhashi et al. ................. | 310/316.01 |
| 5,942,835 | 8/1999 | Furuhashi et al. ................. | 310/316.01 |
| 5,962,953 | 10/1999 | Sasuki et al. .................. | 310/316.01 X |

FOREIGN PATENT DOCUMENTS

| | | |
|---|---|---|
| 55-98881 | 7/1980 | Japan . |
| 1293170 | 11/1989 | Japan . |
| 6-167694 | 6/1994 | Japan . |
| 7162052 | 6/1995 | Japan . |
| 8-47265 | 2/1996 | Japan . |
| 951681 | 2/1997 | Japan . |
| 9135573 | 5/1997 | Japan . |
| 9237684 | 9/1997 | Japan . |

OTHER PUBLICATIONS

Naoki Wakoh, et al., *Liquid Crystal Display Back–light Inverter Utilizing Piezoelectric Transformer*, "The Institute of Electronics, Information and Communication Engineers", pp. 17–21 (1995).

*Primary Examiner*—Mark O. Budd
*Attorney, Agent, or Firm*—Ostrolenk, Faber, Gerb & Soffen, LLP

[57] ABSTRACT

A piezoelectric transformer inverter includes: a piezoelectric transformer, one of whose primary electrodes is grounded, which performs voltage conversion of alternating voltage or direct current voltage applied between the primary electrodes and supplies the converted voltage to a load connected to a secondary electrode; a drive unit for supplying alternating voltage or direct current voltage between the primary electrodes of the piezoelectric transformer; a low-pass type resonance circuit unit inserted between the output of the drive unit and the primary electrodes of the piezoelectric transformer; a duty control unit for controlling ON-Duty of the drive unit so that a value of current flowing into the load coincides with a targeted current value; a phase-difference detection unit for detecting a phase difference between the input voltage and the output voltage of the piezoelectric transformer; and a frequency control unit for controlling a driving frequency of the drive unit.

16 Claims, 18 Drawing Sheets

PIEZOELECTRIC-
TRANSFORMER
INPUT VOLTAGE
IN THE CASE OF
INSTALLATION OF
LC RESONANCE CIRCUIT.

PIEZOELECTRIC-
TRANSFORMER
OUTPUT VOLTAGE
IN THE CASE OF
INSTALLATION OF
LC RESONANCE CIRCUIT.

λ/2 MODE-PIEZOELECTRIC OSCILLATION

λ MODE-PIEZOELECTRIC OSCILLATION

3 λ/2 MODE-PIEZOELECTRIC OSCILLATION

LC RESONANCE STEP-UP
RATIO AT FREQUENCY
IN WHICH PIEZOELECTRIC
TRANSFORMER
HAS THE HIGHEST
EFFICIENCY.

DUTY RATIO AT MAXIMUM
(AT MAXIMUM OUTPUT)

PIEZOELECTRIC TRANSFORMER INVERTER

BACKGROUND OF THE INVENTION

1. Field of the Invention

The present invention relates to a piezoelectric transformer inverter for converting direct current voltage into alternating voltage by using a piezoelectric transformer. More specifically, it relates to a piezoelectric transformer inverter for lighting a cold cathode tube used for back-lighting of a crystal-liquid display panel.

2. Description of the Related Art

Recently, as a display of a portable information-processing device, such as a mobile phone or a notebook-size personal computer, a liquid-crystal display with back-lighting has been used. As a light source of back-lighting, a fluorescent tube such as a cold cathode tube is used. In order to light the fluorescent tube, high alternating voltage needs to be applied. In addition, as an input power supply of a portable information-processing device, such as a notebook-size personal computer, both a battery and an AC adapter are ordinarily used together. Such back-lighting requires a fluorescent-tube-lighting system, such as a DC/AC inverter for converting low direct current voltage supplied from an input power supply into high alternating voltage capable of lighting the fluorescent tube.

Recently, for use in lighting a fluorescent-tube, a piezoelectric transformer inverter incorporating a smaller type of piezoelectric transformer than an electromagnetic transformer has been under development. For such use, a piezoelectric transformer inverter is required to have the following performance capabilities:

(1) the ability to perform a variable control of the tube current of a cold cathode tube so as to adjust the luminance of a liquid-crystal display panel;

(2) a wide input-voltage range so as to be driven either by batteries or a battery charger; and (3) a high efficiency to prolong the operating time.

Before describing conventional piezoelectric inverters, a Rosen-type piezoelectric transformer, which is typically used in such systems, will be described. As shown in FIG. 1, there is provided a Rosen-type piezoelectric transformer 1, in which in one-side region in the length direction, a primary electrode 3 is formed on both front-and-back main surfaces of a piezoelectric substrate 2 made of a piezoelectric ceramic material, and the piezoelectric substrate 2 is polarized in a direction perpendicular to both of the primary electrodes 3 (i.e. in the thickness direction of the piezoelectric substrate 2). A secondary electrode 4 is formed on an end face of the piezoelectric substrate 2, and the region on which the secondary electrode 4 is present is polarized in the length direction.

In the Rosen-type piezoelectric transformer 1, when alternating voltage by an input power supply 5 is applied between the primary electrodes 3, the voltage is converted into mechanical distortion. This distortion excites oscillation in the length direction, and the mechanical oscillation is again converted into electrical oscillation to be taken out from the secondary electrode 4 so as to perform a transformer step-up function, whereby the stepped-up voltage is applied to a load 6 (a fluorescent tube).

FIGS. 2(a), (b), (c), (d), and (e) respectively show for the Rosen-type piezoelectric transformer 1, the step-up ratio, the conversion efficiency, the input/output phase difference, and the frequency characteristics of the input impedance, when the load resistance $R_L$ is 1M, 100 k, and 20 k, respectively. In general, the peak of the step-up ratio (=output voltage/input voltage) of the piezoelectric transformer 1 is in the proximity of a resonance frequency fr (=a frequency at which input impedance is the minimum), and an input/output phase difference (=a difference between the phase of output voltage and the phase of input voltage) inverts from 0° to 180° in the proximity of the peak of the step-up ratio. In addition, the peak of conversion efficiency is between the resonance frequency fr and an anti-resonance frequency fa (=a frequency at which input impedance is the maximum). The frequency at which conversion efficiency is at peak is indicated by fd. Furthermore, in FIG. 2, the resonance frequency fr, the anti-resonance frequency fa, and the frequency fd at which conversion efficiency is at peak, are equivalent to those in a case in which load resistance is 100 k.

(First Conventional Embodiment)

Next, a description will be given of a conventional piezoelectric transformer inverter. In a piezoelectric transformer inverter used as back-lighting of a liquid crystal display panel, as described above, variable control of load current (tube current of a cold cathode tube) needs to be performed so as to adjust the luminance of the liquid crystal display panel (the aforementioned requirement (1)). A piezoelectric transformer inverter to meet the requirement, for example, is disclosed in Japanese Unexamined Patent Publication No. 6-167694. As shown in FIG. 3, this takes advantage of changes in the step-up ratio of a piezoelectric transformer as a function of a driving frequency. When control is performed on the higher-frequency side of the peak of the step-up ratio, if a smaller load current is desired, the driving frequency is set to be higher and the step-ratio is set to be smaller, whereas in case a larger load current is desired, the driving frequency is set to be lower and the step-ratio is set to be larger, so that the load current is controlled to be constant. A piezoelectric transformer inverter of such a system has been widely used due to its simple method for controlling load current.

In the piezoelectric transformer inverter of such a system, however, in case a power supply voltage is high or load current is set to be smaller, it is driven in a frequency region of low conversion efficiency, which greatly deviates from the proximity of a resonance point fr or anti-resonance point fa of the piezoelectric transformer, whereby there is a problem of significantly low efficiency, (that is, this does not meet the aforementioned requirement (3)).

(Second Conventional Embodiment)

In order to solve these problems, there are some methods in which high efficient drive is performed in the proximity region of a frequency fd of a conversion efficiency peak by controlling a piezoelectric transformer so that a phase difference in piezoelectric-transformer driving signals is maintained constant, and load current is controlled to be constant by changing the ON-Duty of a switching device. A piezoelectric transformer inverter having such a system has been disclosed in Japanese Unexamined Patent Publication No. 55-98881, Japanese Unexamined Patent Publication No. 1-293170, Japanese Unexamined Patent Publication No. 9-237684, and Japanese Unexamined Patent Publication No. 9-135573, etc.

A piezoelectric transformer inverter 11 as disclosed in Japanese Unexamined Patent Publication 55-98881 is shown in FIG. 4. A drive oscillation transformer 12 drives a piezoelectric transformer 13, and a drive circuit 14 and push-pull transistors 15 and 16 perform a push-pull switching driving with respect to the transformer 12. After an output voltage $V_O$ of the piezoelectric transformer inverter 11 is divided by voltage-divider resistors 17 and 18, it is compared with a reference voltage E of a direct-current power supply 20 to be amplified by an amplifier 19, and then it is input to one of the inputs of a comparator 21 as an error output.

A phase detector 22 detects the input voltage and the input current of the piezoelectric transformer 13 and converts the voltage-current phase difference into voltage to input to a voltage-controlled oscillator 23. In the voltage-controlled oscillator 23, the frequency changes according to the output voltage of the phase detector 22, and the output of the voltage-controlled oscillator 23 is supplied to the other input of the comparator 21. A pulse output is conveyed from the comparator 21 to the drive circuit 14 corresponding to an error level. In other words, when a voltage output $V_o$ is lowered, the output of the amplifier 19 is lowered and the drive-pulse width of the drive oscillation transformer 12 is increased. As a result, on a secondary side of the drive oscillation transformer 12, voltage of a basic wave component corresponding to an oscillation frequency is heightened and input current of the piezoelectric transformer 13 is increased to raise the output. This system can improve output stability with respect to load fluctuations.

In order to use a piezoelectric transformer efficiently, it needs to be driven at a frequency coinciding with the resonant frequency fr of the piezoelectric transformer. In addition, it is known that the phase difference between input current and input voltage of the piezoelectric transformer deviates by 90° at a resonance point. Thus, in the piezoelectric transformer inverter 11, a phase difference between the input current and the input voltage of piezoelectric transformer 13 is controlled in such a manner that the phase difference between them is 90°, as described above, in which control is performed so as to make the output voltage (conversion efficiency) of the piezoelectric transformer 13 maximum, as shown in FIGS. 5(a) and (b).

In the piezoelectric transformer inverter 11, however, a resistor 24 for detecting input current is used, in which input current of the piezoelectric transformer 13 is larger than output current of the same, so that there is a problem in which a loss due to the resistor 24 for detecting input current is large. Furthermore, in this system, since the piezoelectric transformer 13 is driven by rectangular waves, a loss associated with electrical charging/discharging of the piezoelectric transformer input capacity is large, leading to difficulty in achieving high efficiency.

(Third Conventional Embodiment)

Next, FIG. 6 shows a system disclosed in Japanese Unexamined Patent Publication No. 1-293170. Although this is not a drive circuit of a piezoelectric transformer, a phase difference between the input voltage $V_I$ and the input current $I_I$ of a piezoelectric vibrator 31 is maintained constant to achieve high efficiency. In this conventional embodiment, as shown in FIG. 6, the input voltage $V_I$ and the input current $I_I$ of the piezoelectric vibrator 31 are compared by a phase comparison unit 32, and a control oscillator 33 controls a switching device 34 to make the phase of the input voltage $V_I$ the same as that of the input current $I_I$, whereby the piezoelectric vibrator 31 is driven at a resonance frequency.

However, regarding the attempt of using such a circuit and a controlling system in a piezoelectric transformer inverter, there is difficulty in using them due to a difference between input phase characteristics stemming from the difference in load resistance values. In addition, in the circuit and the controlling system, a step-up electromagnetic transformer 35 is used in the front stage of the piezoelectric vibrator 31. Because of the relatively large size of such a transformer, the circuit and the controlling system are not suitable for lighting a cold cathode tube, which is required to have a low height and a reduced size.

(Fourth Conventional Embodiment)

FIG. 7 shows a structure of a piezoelectric transformer inverter 41 disclosed in Japanese Unexamined Patent Publication No. 9-237684. In the piezoelectric transformer inverter 41, a phase difference between the input voltage and the output voltage (measured as a midpoint voltage of two voltage-divider resistors 43 and 44) of a piezoelectric transformer 42 is detected by a phase-difference detection circuit 45, and according to the phase difference, a control circuit 46 controls the oscillation frequency of a voltage-controlled oscillation circuit 47, whereby the driving frequency of input voltage applied to the piezoelectric transformer 42 from a transformer-driving unit 48 is controlled so that the phase difference between the input voltage and the output voltage of the piezoelectric transformer 42 is 90°.

However, in this system, since the phase difference between the input voltage and the output voltage at the step-up peak point is not 90° under the condition of practical use in which a cold cathode tube 49 is lit (The Institute of Electronics, Information and Communication Engineers: Technical Report US95-22, EMD95-18, and CPM95-30, appropriate control cannot be performed. Furthermore, since the piezoelectric transformer 42 is driven by rectangular waves in this conventional system, there is a problem in which a loss associated with charging/discharging of the piezoelectric-transformer input capacity is large.

(Fifth Conventional Embodiment)

An output current phase differences and a conversion efficiency of a piezoelectric transformer inverter disclosed in Japanese Unexamined Patent Publication No. 9-135573, are shown in FIG. 8. The duty control of the piezoelectric transformer of this embodiment is permitted only in the case in which the phase difference is in a constant phase range (P1–P2), whereas the duty control is stopped for a while in the case in which the phase deviates from the constant phase range P1–P2 due to some disturbance.

Although such a controlling system can be achieved if a micro-computer or the like is used, since the size of the resultant circuit is large, product cost is increased and, accordingly, it is not practical in terms of cost.

(Sixth Conventional Embodiment)

Furthermore, when input voltage is high or load current is reduced to be smaller, a piezoelectric transformer is driven in a frequency region of low conversion efficiency, which greatly deviates from a resonance point fr and an anti-resonance point fa of the piezoelectric transformer. As another method for solving the problem in which there is a significant efficiency reduction, for example, there is a method for performing self-exciting oscillation of a piezoelectric transformer at a resonance frequency, as disclosed in Japanese Unexamined Patent Publication No. 7-162052, Japanese Unexamined Patent Publication No. 8-47265, etc., and a method for reducing frequency control width to suppress conversion efficiency reduction by using frequency control as the final adjustment of load current, while changing the ON-Duty of a switching device according to the input voltage, as disclosed in Japanese Unexamined Patent Publication No. 9-51681.

In a piezoelectric transformer inverter 51 disclosed in Japanese Unexamined Patent Publication No. 7-162052, as shown in FIG. 9, an LC resonance circuit 53 is disposed in the piezoelectric-transformer input stage, and the output voltage of the piezoelectric transformer 52 is divided by voltage-divider resistors 54 and 55 to give feedback to the input by a feedback circuit 56 so as to perform self-exciting oscillation. In this piezoelectric transformer inverter 51, since the LC resonance circuit 53 is disposed in the piezoelectric-transformer input stage, there is no loss associated with charging/discharging of the piezoelectric-transformer input capacity.

However, owing to the reason below, this system has a problem in which the piezoelectric transformer 52 cannot be driven at a frequency fd of conversion efficiency peak. In other words, as shown in Japanese Unexamined Patent Publication No. 52-45013, although the step-up ratio by the piezoelectric transformer input 52 itself has a mountainous or single hump form, when the LC resonance circuit 53 is disposed in the piezoelectric-transformer input, the frequency characteristics of the piezoelectric-transformer input voltage is in the form of double-humps as shown in FIG. 10(*a*). As a result, the frequency characteristics of the piezoelectric-transformer output voltage are also of double-hump form as shown in FIG. 10(*b*). Since oscillation is sustained at a frequency at which a feedback gain is maximum in the self-exciting oscillation circuit, an operating frequency is equivalent to one of the two humps (a peak) of the piezoelectric-transformer output voltage. However, since the frequency fd of the conversion efficiency peak is a frequency at a bottom between the double humps, it is understood that the piezoelectric transformer is driven at a frequency with poor efficiency in the conventional embodiment shown in FIG. 9.

A simple description will be given of the reason that an LC resonance circuit creates the double-hump form of the piezoelectric-transformer input current. As seen in the electrical characteristics of the piezoelectric transformer shown in FIG. 2, in a region apart from the frequency fd of a conversion efficiency peak, the input phase is approximately −90°, namely, it shows capacitance. Consequently, the Q value of the LC resonance circuit including the input impedance of the piezoelectric transformer is increased, so that the input voltage of the piezoelectric transformer is stepped up. Meanwhile, the input phase is close to 0° at a frequency in the proximity of a frequency fd of conversion efficiency peak. That is, the Q value of the LC resonance circuit is lowered and a step-up operation by LC resonance is reduced, so that the input voltage of the piezoelectric transformer is lowered. As a result, the input voltage is reduced at a frequency fd of conversion efficiency peak, whereas the input voltage is increased on both sides of the peak frequency so as to form double humps.

(Seventh Conventional Embodiment)

Next, FIG. 11 shows a piezoelectric transformer inverter 61. In this piezoelectric transformer inverter 61, a switching circuit 66 of a full-bridge structure, including four switching devices 62, 63, 64, and 65, is connected between primary electrodes 68 of the piezoelectric transformer 67 to provide the step-up ratio, while the output voltage is divided by a load 69 and a resistor 70 and feedback of the divided voltage is supplied to the input to perform self-exciting oscillation. In this system, since the frequency characteristics of the output voltage are not in the form of double-humps as in the case of Japanese Unexamined Patent Publication No. 7-162052 (the sixth conventional embodiment), the transformer can be driven in the proximity of a resonance frequency with the highest gain.

However, in this piezoelectric transformer inverter 61, since the piezoelectric transformer 67 is driven by switching on/off the switching circuit 66 by rectangular waves output from a drive circuit 71, there is a problem of loss associated with charging/discharging of the piezoelectric-transformer input capacity.

(Eighth Conventional Embodiment)

FIG. 12 shows a piezoelectric transformer inverter 81 disclosed in Japanese Unexamined Patent Publication No. 9-51681. In the piezoelectric transformer inverter 81, the ON-Duty of a switching circuit 84, in which two switching devices 82 and 83 are made into a half-bridge, is controlled according to a power supply voltage $V_{CC}$. In addition, the output voltage of the piezoelectric transformer 85 is detected by a detection circuit 86 to convert into a frequency by a V-f conversion circuit 87 so as to control a drive circuit 88, whereby frequency-control of the output voltage is performed. With the piezoelectric transformer inverter 81, since input-voltage fluctuations can be absorbed by the ON-Duty, the workload in frequency control is lightened and thereby results in gaining of an advantage in which the frequency-fluctuation width associated with output-voltage control is not increased.

In this conventional embodiment, however, since the LC filter 89 is disposed in the input stage of the piezoelectric transformer 85, as explained in referring to FIG. 10, the frequency characteristics of the piezoelectric-transformer output voltage are in the form of double-humps, in which frequency control is actually very difficult. For instance, when the piezoelectric transformer 85 is driven at a frequency fd of conversion efficiency peak, if the inverter output is increased due to some disturbance, the piezoelectric transformer inverter 81 tries to lower the piezoelectric-transformer output voltage by increasing the driving frequency. However, in order to lower the step-up ratio of the piezoelectric transformer 85, it is necessary to go beyond one of the two humps (peaks) of the output-voltage frequency characteristics, whereby the driving frequency greatly increases, so that the operation becomes very unstable.

SUMMARY OF THE INVENTION

The present invention has been made to solve the technical problems above. The purpose of the invention is to provide a piezoelectric transformer inverter capable of converting direct-current input voltage into alternating output voltage at a high conversion efficiency and capable of driving a piezoelectric transformer in a stable manner, with a combination of analog controls.

A piezoelectric transformer inverter according to a first embodiment of the present invention includes: a piezoelectric transformer, one of whose primary electrodes is grounded, which performs voltage conversion of an alternating input voltage or a direct current input voltage applied between the primary electrodes to supply an output voltage to a load connected to a secondary electrode; a drive unit for supplying the alternating input voltage or the direct current input voltage between the primary electrodes of the piezoelectric transformer; a low-pass type resonance circuit unit inserted between the output of the drive unit and the primary electrodes of the piezoelectric transformer; a duty control unit for controlling ON-Duty of the drive unit so that a value of current flowing into the load coincides with a targeted current value; a phase-difference detection unit for detecting a phase difference between the input voltage and the output voltage of the piezoelectric transformer; and a frequency control unit for controlling a driving frequency of the drive unit so that the phase difference has a specified value.

As a drive unit for supplying alternating voltage or direct current voltage to the primary electrodes, for example, a half-bridge drive unit including two transistors can be used. In addition, as a low-pass type resonance circuit unit, a low pass filter including a coil and a capacitor can be used. More specifically, the low-pass type resonance circuit unit can be formed by the coil connected between the output of the drive unit and the primary electrodes of the piezoelectric transformer and the capacitor connected in parallel between the primary electrodes of the piezoelectric transformer. Since the piezoelectric transformer does not perform voltage conversion with respect to the direct-current voltage component applied between the primary electrodes due to its properties, it can be driven by using signals in which direct current superimposes on alternating current. Furthermore, there is no problem even if it is driven by using signals in which the direct current voltage component is zero.

In this piezoelectric transformer inverter, since the low-pass type resonance circuit unit is disposed between the drive unit and the piezoelectric transformer, harmonic components contained in the output of the drive unit can be blocked and thereby the piezoelectric transformer can be driven by substantial sine waves, so that losses associated with charging/discharging of the piezoelectric-transformer input capacity can be extremely reduced to improve efficiency of the piezoelectric transformer inverter. Moreover, since the step-up operation of the resonance circuit unit can back up stepping-up by the piezoelectric transformer, a piezoelectric transformer having a small step-up ratio can be used, and a small-size piezoelectric transformer or a low-cost piezoelectric transformer can be used.

Additionally, with operations of the phase-difference detection unit and the frequency control unit, control for maintaining the phase difference between the input voltage and the output voltage constant permits the driving frequency to be fixed in the proximity of the frequency with the highest efficiency. Thus, even when the resonance circuit unit is inserted between the drive unit and the piezoelectric transformer, in which the frequency characteristics are in the form of double-humps, the piezoelectric transformer can be driven in a stable manner at the bottom between the double-humps of the frequency characteristics.

Since the system for controlling in such a manner that the phase difference between the input voltage and the output voltage is maintained constant is used, the efficiency is more satisfactory than that in the system of detecting input current. Accordingly, it is possible to provide a piezoelectric transformer inverter particularly suitable for a purpose requiring a wide input-voltage range and high efficiency.

Furthermore, the structure can be simplified since the piezoelectric transformer inverter can be obtained by analog-control.

A piezoelectric transformer inverter according to a second embodiment of the present invention includes: a piezoelectric transformer for performing voltage conversion of an alternating input voltage or a direct current input voltage applied between primary electrodes to supply an output voltage to a load connected to a secondary electrode; a drive unit for supplying the alternating input voltage or the direct current input voltage separately to the two primary electrodes of the piezoelectric transformer; a low-pass type resonance circuit unit inserted between the output of the drive unit and the primary electrodes of the piezoelectric transformer; a duty control unit for controlling the ON-Duty of the drive unit so that a value of current flowing into the load coincides with a targeted current value; a phase-difference detection unit for detecting a phase difference between the input voltage and the output voltage of the piezoelectric transformer; and a frequency control unit for controlling a driving frequency of the drive unit so that the phase difference has a specified value.

The piezoelectric transformer inverter according to the second embodiment has the following advantages in addition to the operational advantages of the piezoelectric transformer inverter according to the first embodiment. Because this piezoelectric transformer inverter uses the drive unit for supplying alternating voltage or direct current voltage separately to the two primary electrodes of the piezoelectric transformer, as such a drive unit, for example, it is possible to use a full-bridge drive circuit using four transistors. Since use of such a drive unit can increase the input voltage of the piezoelectric transformer, the step-up ratio of the piezoelectric transformer can be reduced. Thus, it is possible to use a piezoelectric transformer, which has a simple structure and is low-cost. Furthermore, as the double harmonic component is smaller, the distortion component contained in the piezoelectric-transformer output voltage can be reduced.

The low-pass type resonance circuit unit used in the piezoelectric transformer inverter may include a coil connected between the output of the drive unit and the primary electrodes of the piezoelectric transformer and a capacitor connected in parallel between the primary electrodes of the piezoelectric transformer, in which the capacitor has a capacitance not larger than four times the amount of the piezoelectric-transformer input capacity measured at a frequency sufficiently lower than the resonance frequency of the piezoelectric transformer; and a resonance frequency determined by a combined capacitance, which is the sum of the capacitance of the capacitor and the piezoelectric-transformer input capacity, and the inductance of the coil, is set in a range of ±15% of the driving frequency.

In an application in which a cold cathode tube is lit by using a Rosen-type piezoelectric transformer, when a piezoelectric-transformer has an input capacity $C_P$ and the ratio M of the capacitance $C_C$ of the low-pass type resonance circuit unit to the input capacity $C_P$ ($M=C_C/C_P$), are used as parameters, and when M is set to $M \leq 4$, even if an LC resonance frequency deviates by 15% from a targeted frequency fd, reduction of the LC resonance step-up ratio is at a level of only about −3 dB, so that a practical step-up operation by the LC resonance can be obtained.

As a result, even when the inductance of a coil and the capacitance of a capacitor of the resonance circuit unit vary from a nominal value, the step-up ratio of the resonance circuit unit can be maintained at a practical level, whereby there is a great advantage in suppressing the variations in the characteristics of the piezoelectric transformer inverter.

Further, the phase-difference detection circuit may have two comparators, whose output-terminals are mutually AND-connected, and which are an open-collector output type or an open-drain output type.

When a comparator of the open-collector output type or an open-drain output type is used, the output terminals are connected for a common use to automatically obtain AND, so that an additional logic IC is not necessary for calculating output signals of the comparator. Moreover, usually a comparator IC including two circuits can be obtained at a low cost. Thus, according to this embodiment, a low-cost phase-difference detection unit can be obtained, whereby production cost of the piezoelectric transformer inverter can be suppressed.

The piezoelectric transformer is preferably a Rosen-type piezoelectric transformer of a λ/2 mode.

In the piezoelectric transformer inverter of the present invention, the piezoelectric transformer can be driven not by rectangular waves but by substantial sine waves being filtered by the resonant circuit unit, whereby the Rosen-type piezoelectric transformer of a λ/2 mode which is easily miniaturized can be used. Therefore, use of the Rosen-type piezoelectric transformer of a λ/2 mode permits the piezoelectric transformer inverter to be miniaturized.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

Figure 1:
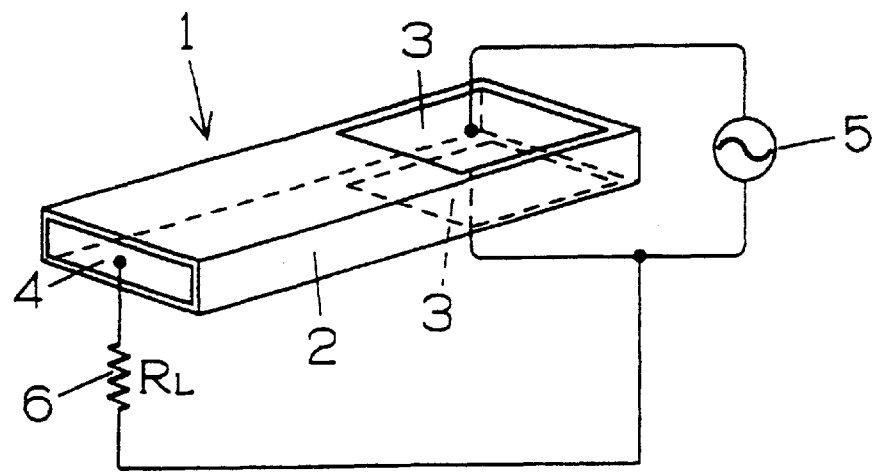
FIG. 1 is a schematic perspective view illustrating a structure of a Rosen-type piezoelectric transformer and a method for driving the same.
Figure 3:
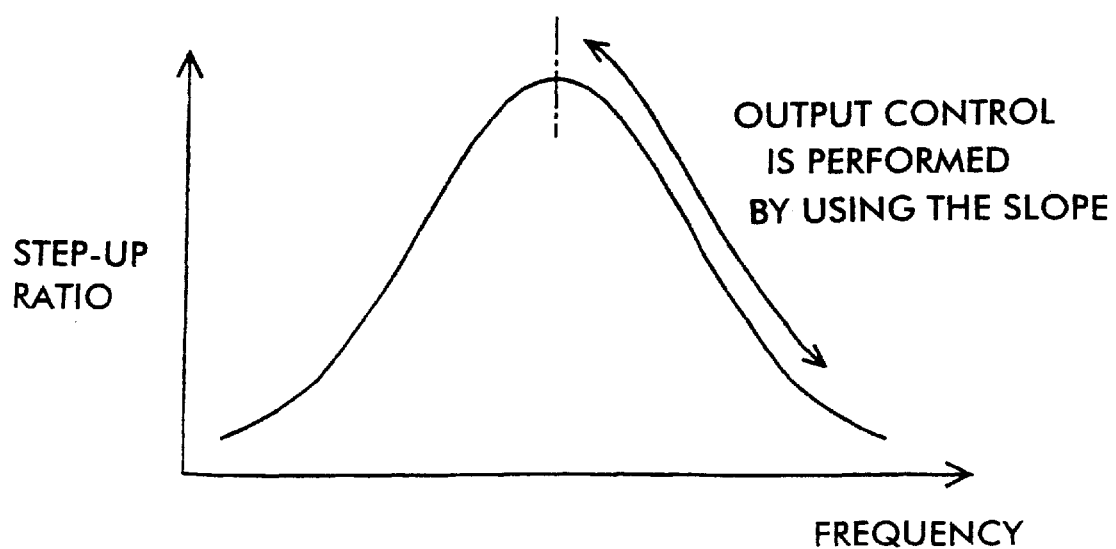
FIG. 3 is a view illustrating the principle of a frequency-controlling system of a piezoelectric transformer in a first conventional embodiment.
Figure 2A:
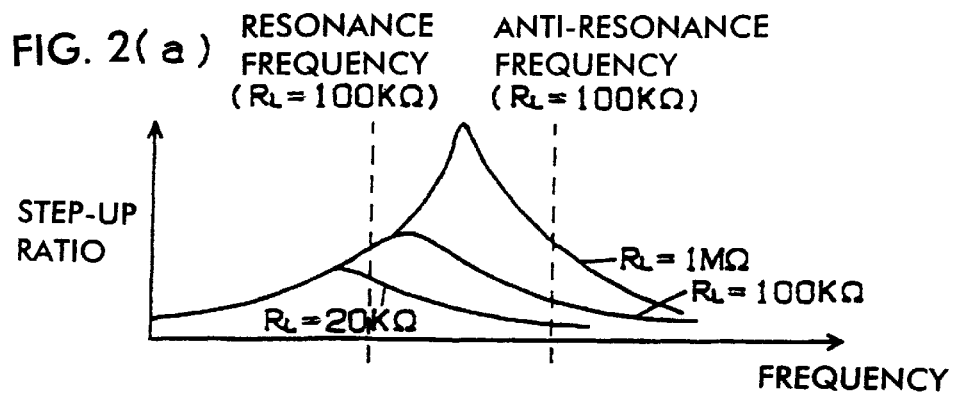
FIG. 2 shows graphs of various frequency characteristics of a piezoelectric transformer, in which (a) indicates a step-up ratio of the piezoelectric transformer, (b) indicates conversion efficiency, (c) indicates phase differences in input/output voltages, (d) indicates phases of input voltages, and (e) indicates input impedance.
Figure 2B:
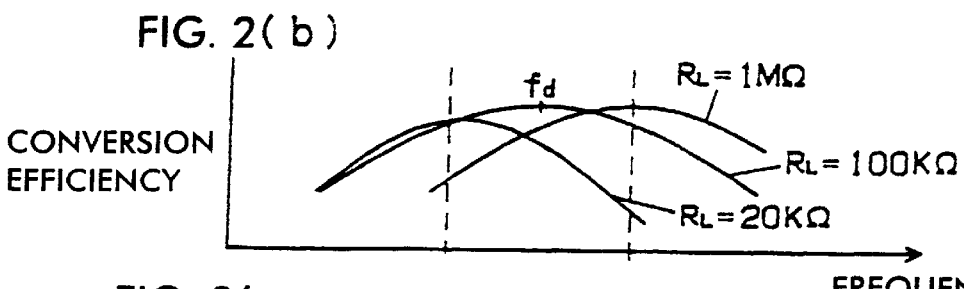
Figure 2C:
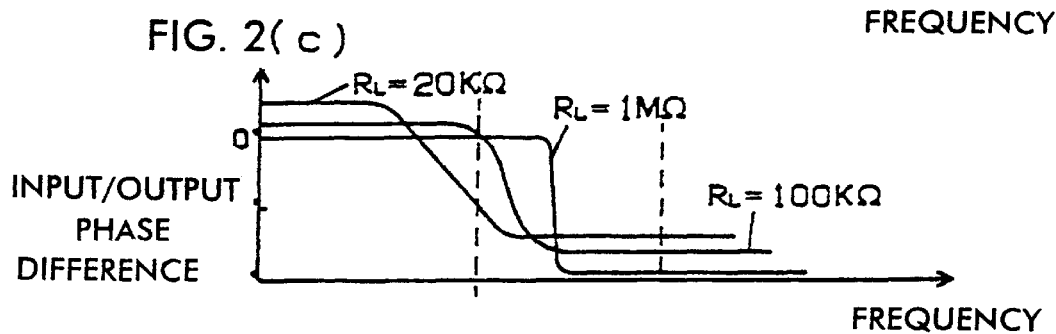
Figure 2D:
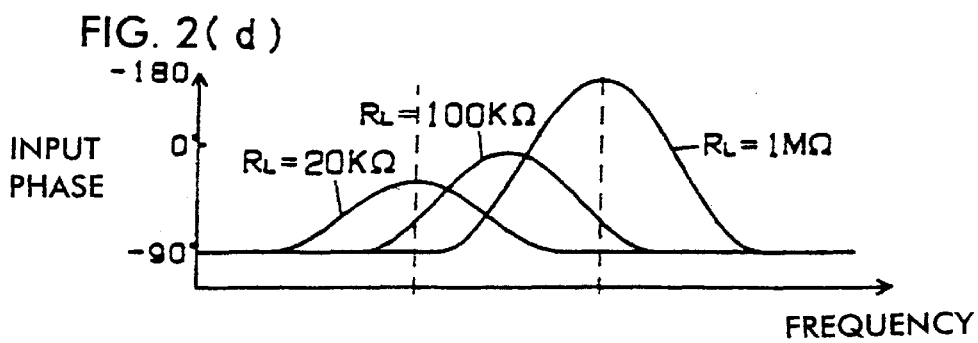
Figure 2E:
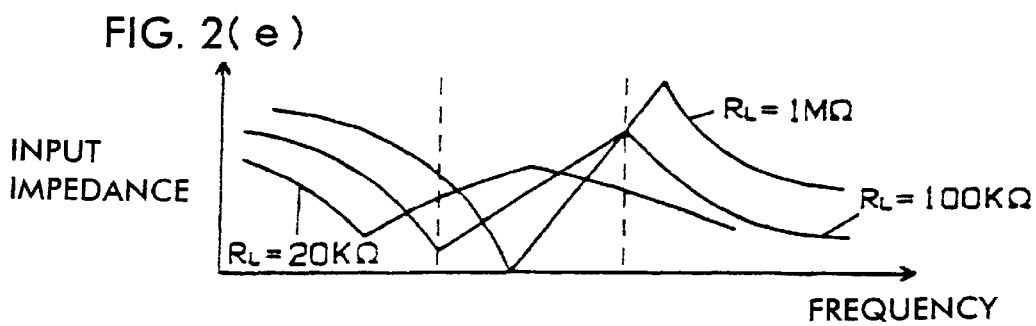
Figure 4:
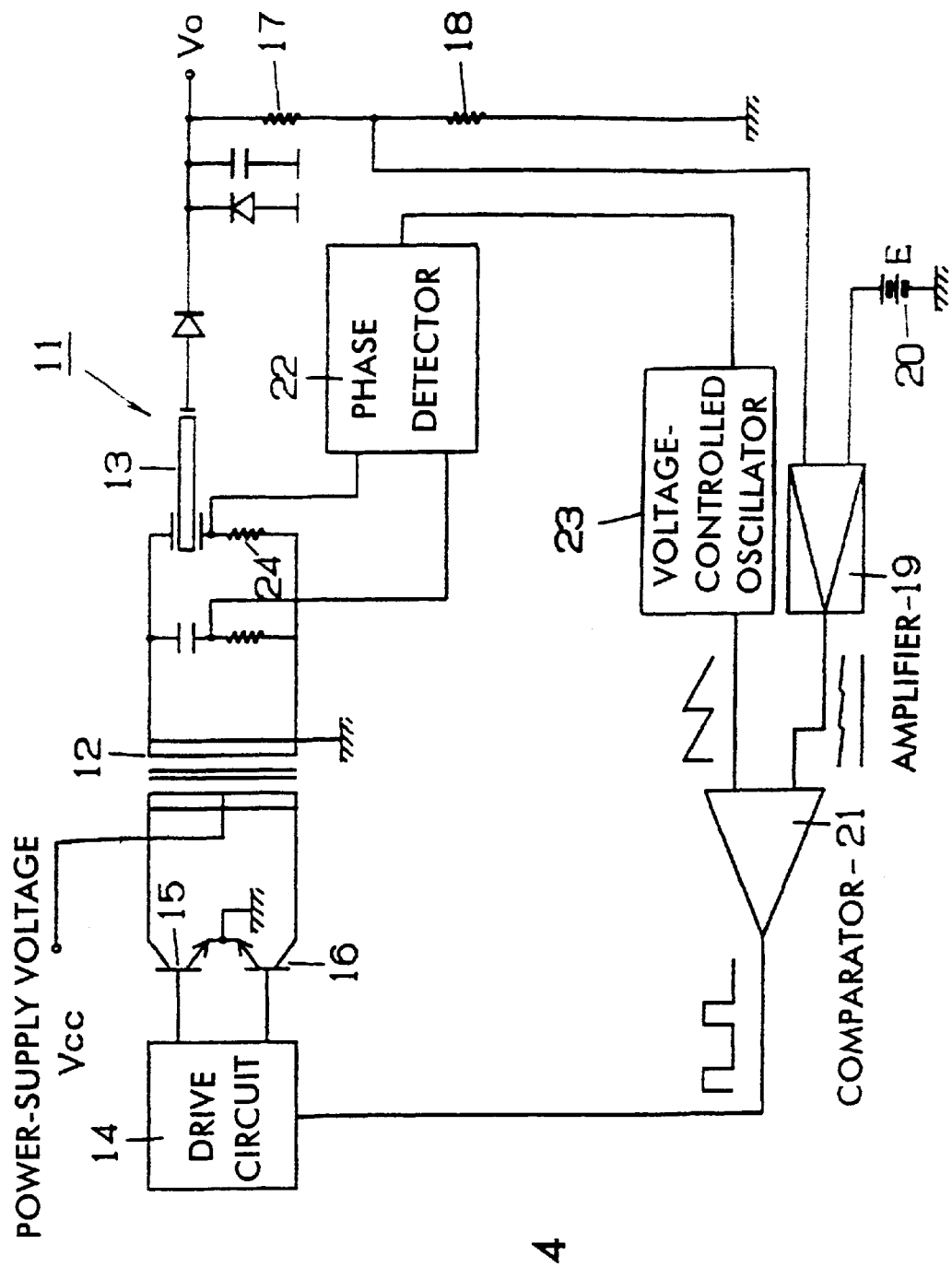
FIG. 4 is a circuit diagram showing a structure of a piezoelectric transformer inverter according to a second conventional embodiment.
Figure 5A:
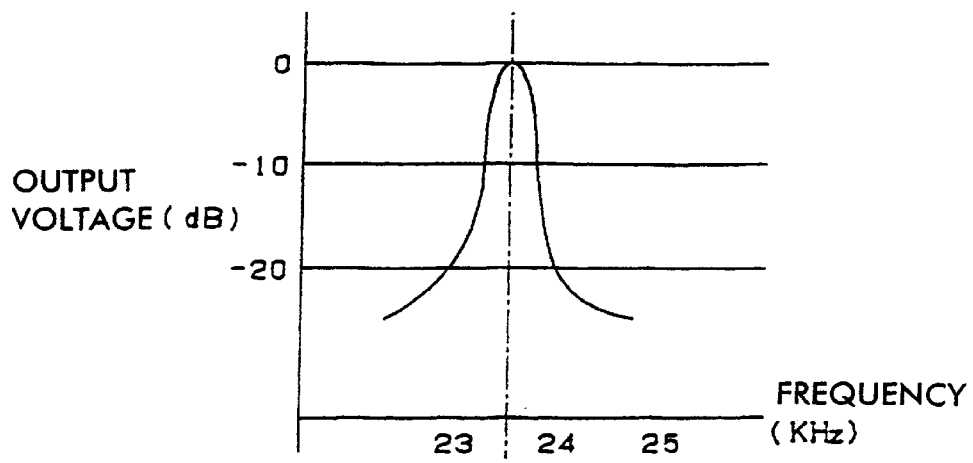
FIGS. 5(a) and (b) are views illustrating the controlling system of a piezoelectric transformer used in the piezoelectric transformer inverter above, in which (a) indicates frequency characteristics of output voltage of the piezoelectric transformer and (b) indicates frequency characteristics of phase differences between input voltage and input current of the piezoelectric transformer.
Figure 5B:
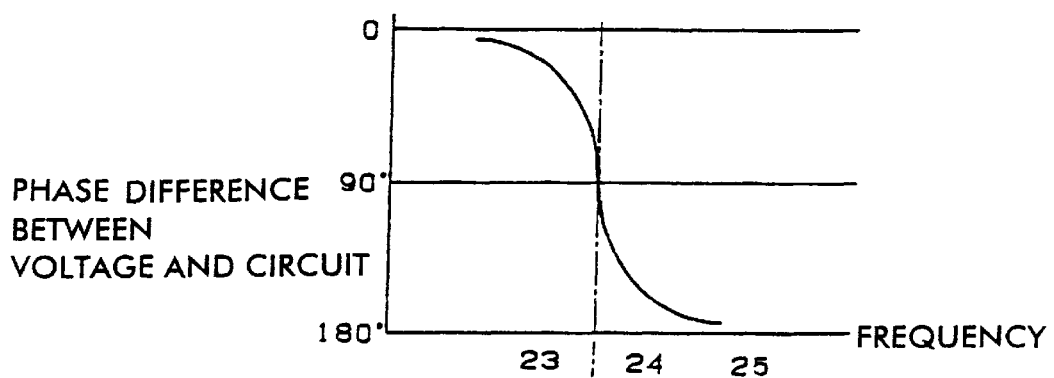
Figure 6:
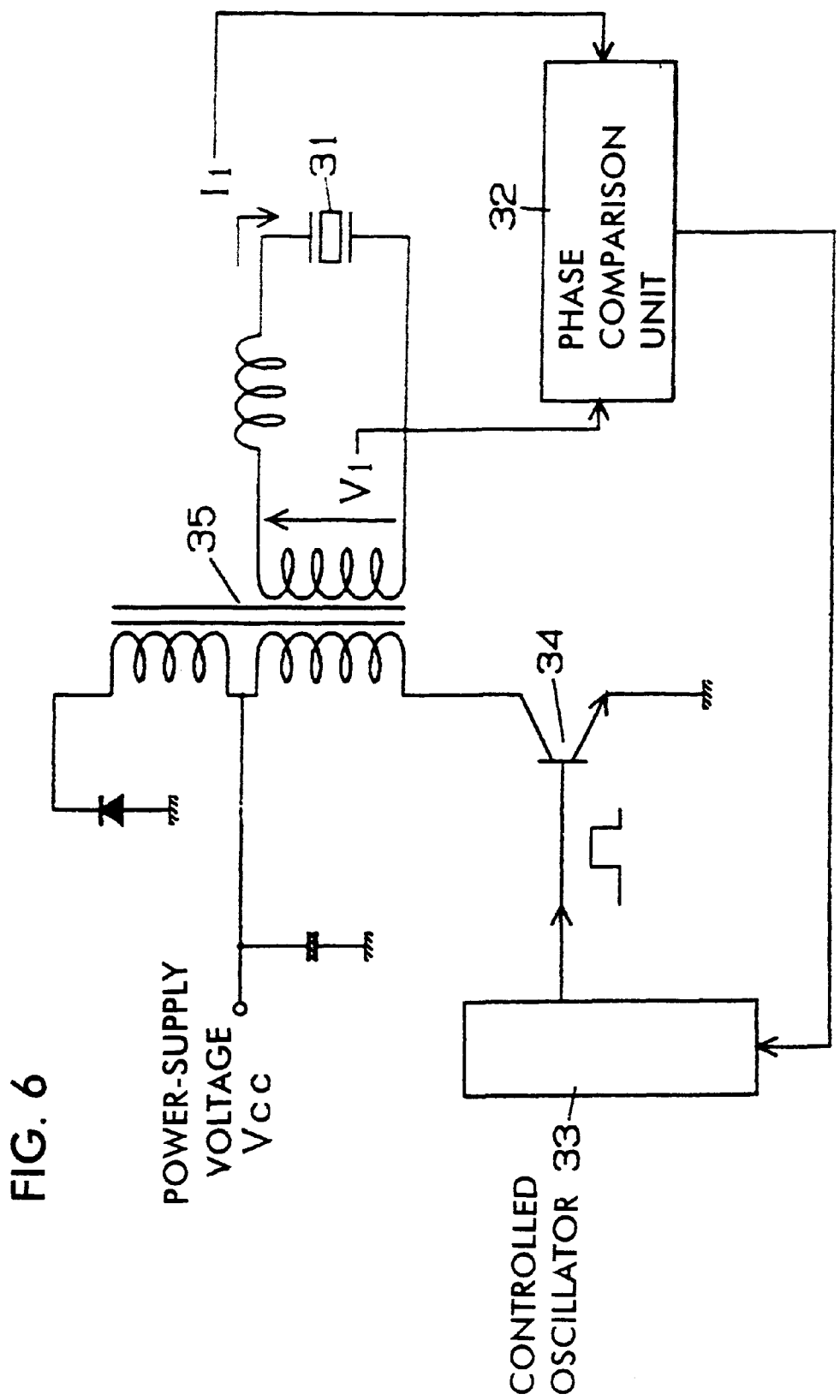
FIG. 6 is a circuit diagram showing a structure of a piezoelectric-resonator drive circuit according to a third conventional embodiment.
Figure 7:
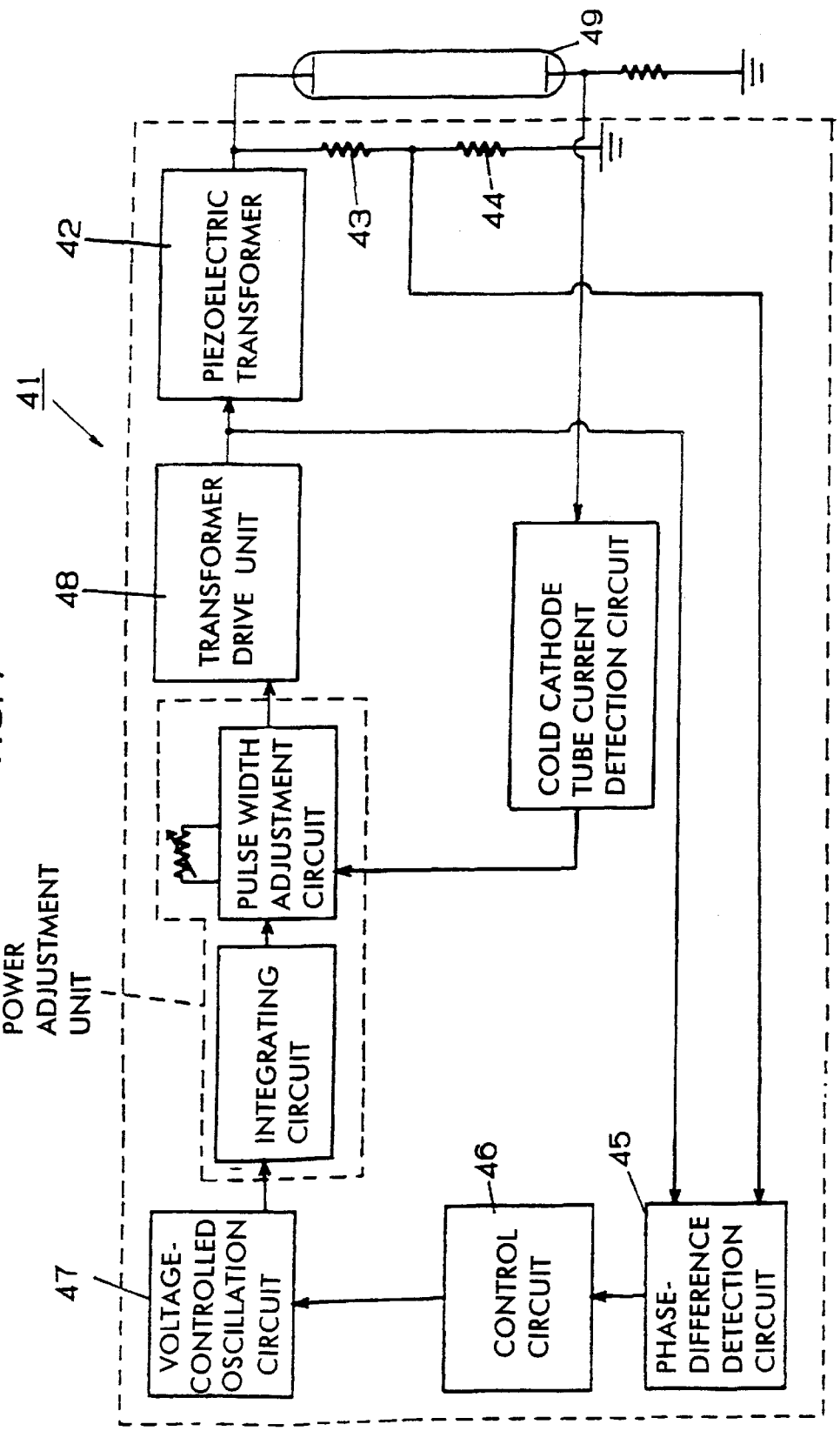
FIG. 7 is a circuit diagram showing a structure of a piezoelectric transformer inverter according to a fourth conventional embodiment.
Figure 8:
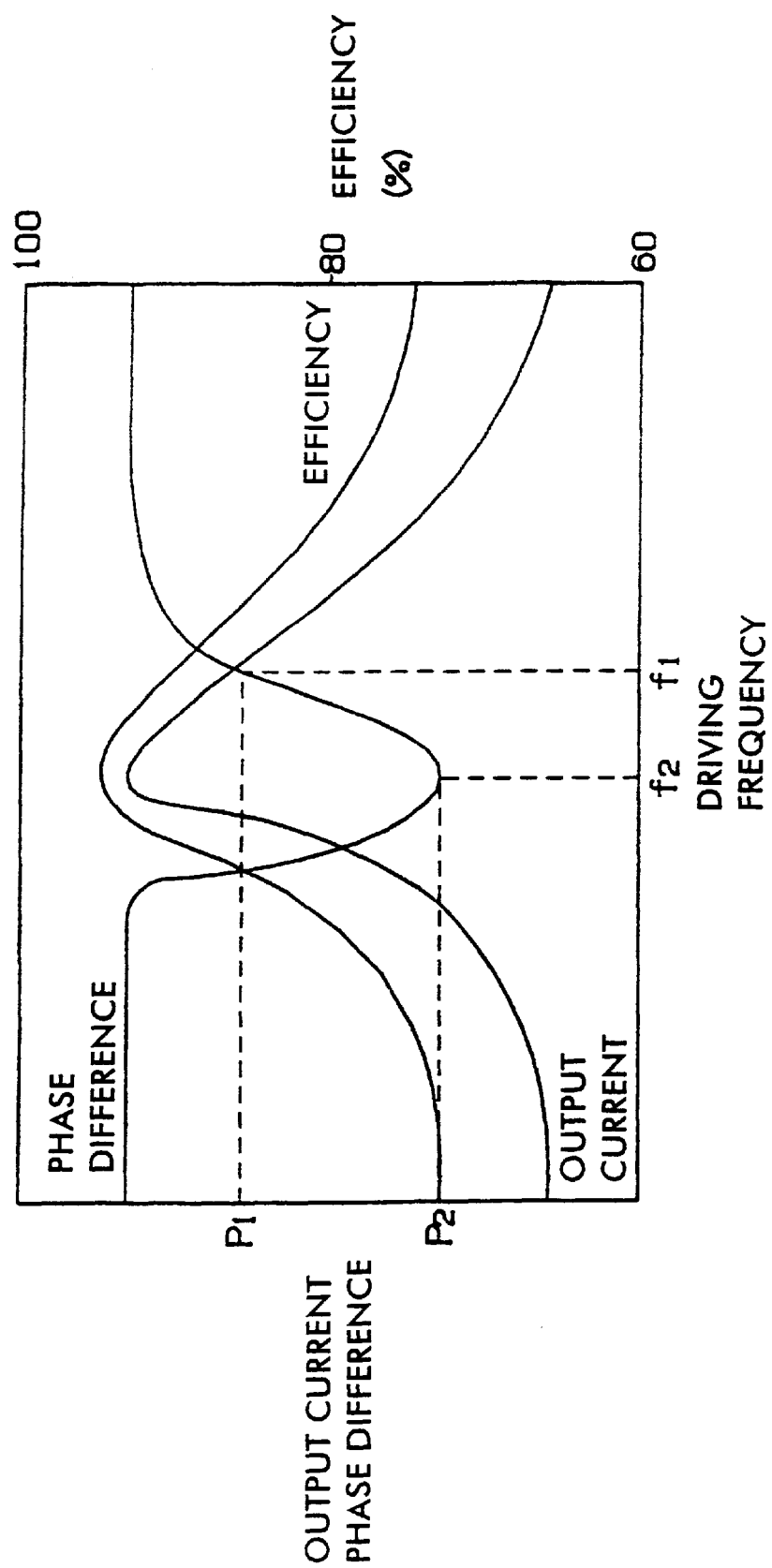
FIG. 8 is a view illustrating a controlling system of a piezoelectric transformer according to a fifth conventional embodiment.
Figure 9:
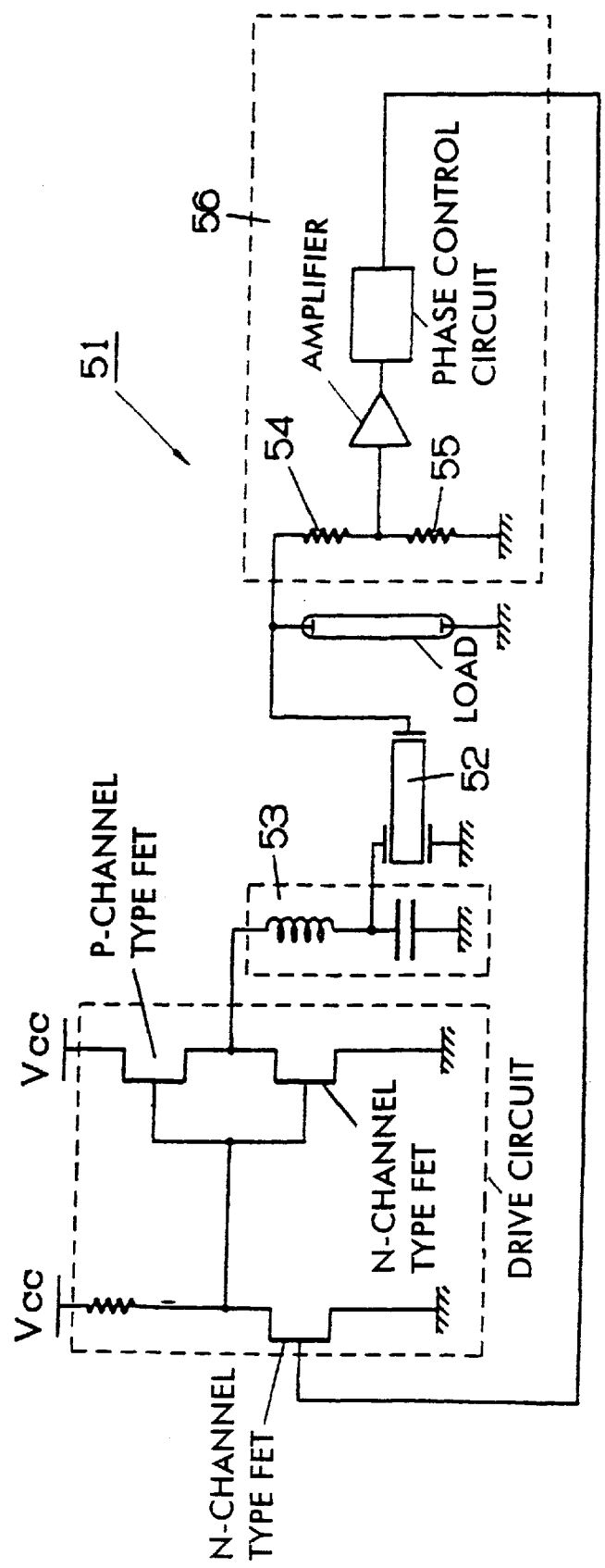
FIG. 9 is a circuit diagram showing a structure of a piezoelectric transformer inverter according to a sixth conventional embodiment.
Figure 10A:
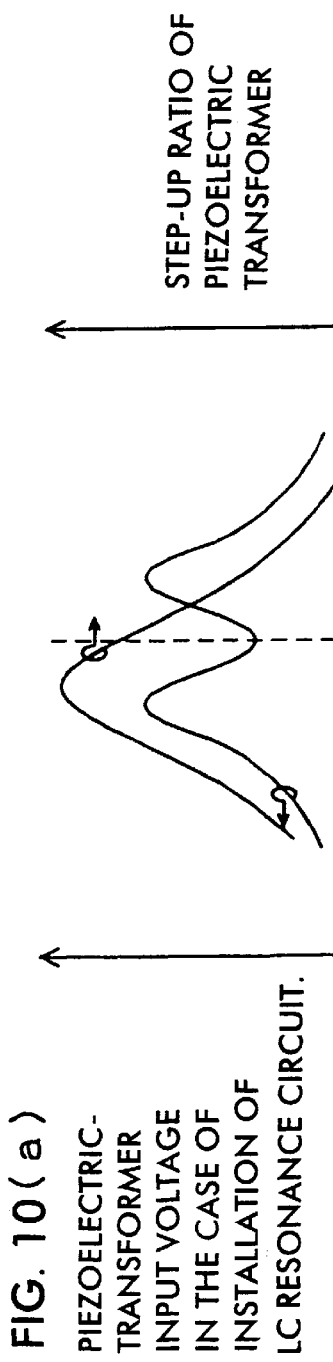
FIGS. 10(a) and (b) are views showing changes in input voltage and output voltage of a piezoelectric transformer in the case of installation of an LC resonance circuit.
Figure 10B:
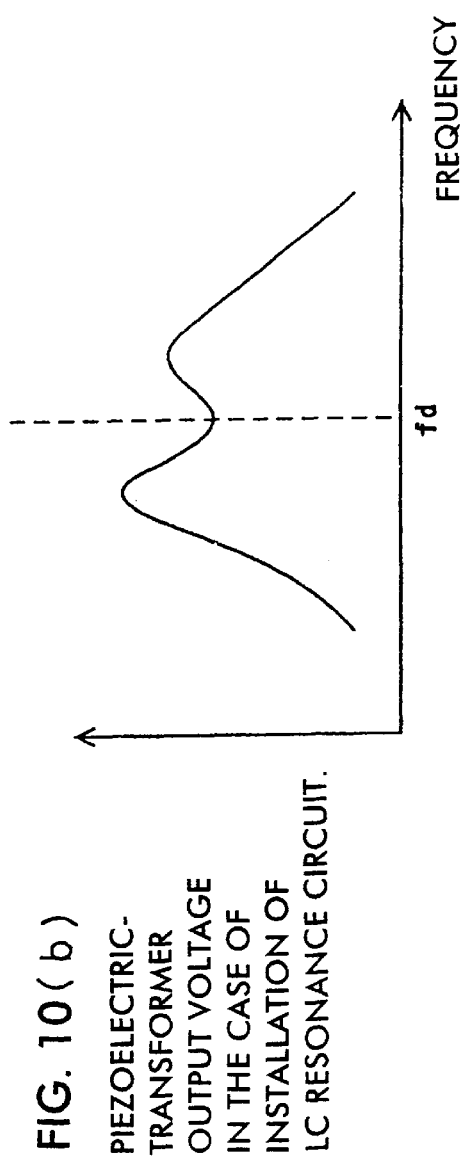
Figure 11:
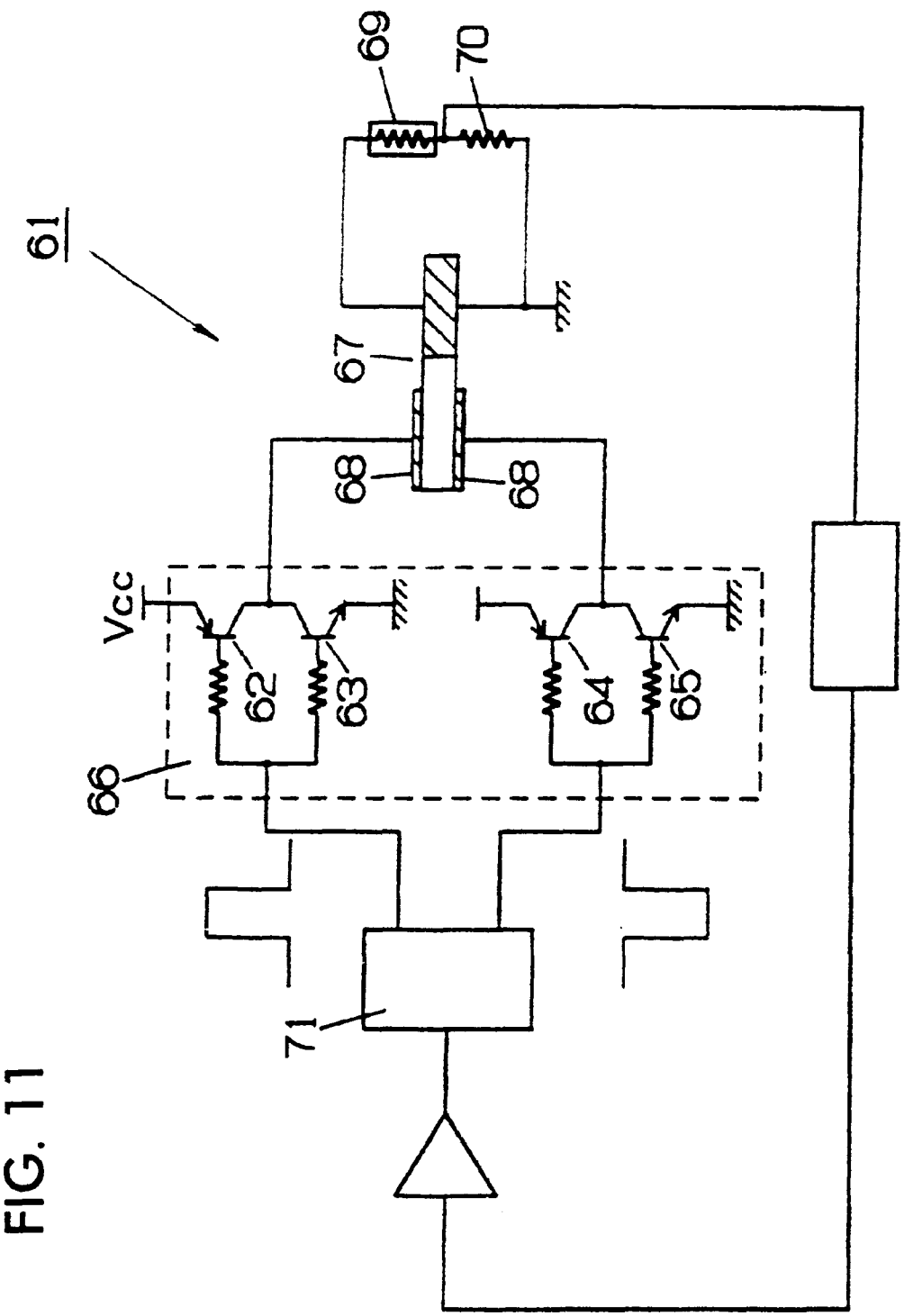
FIG. 11 is a circuit diagram showing a structure of a piezoelectric transformer inverter according to a seventh conventional embodiment.
Figure 12:
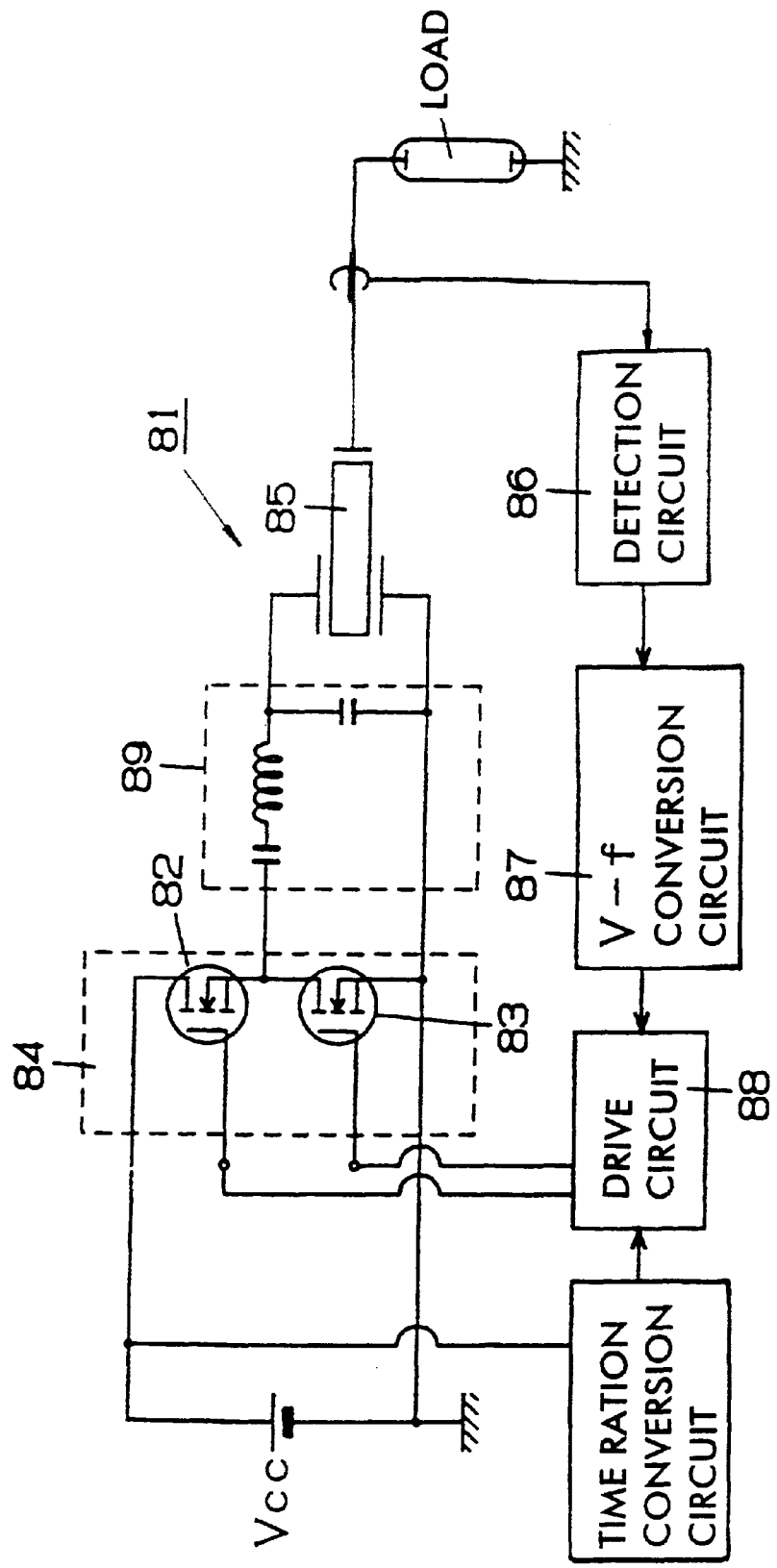
FIG. 12 is a circuit diagram showing a structure of a piezoelectric transformer inverter according to a eighth conventional embodiment.
Figure 13:
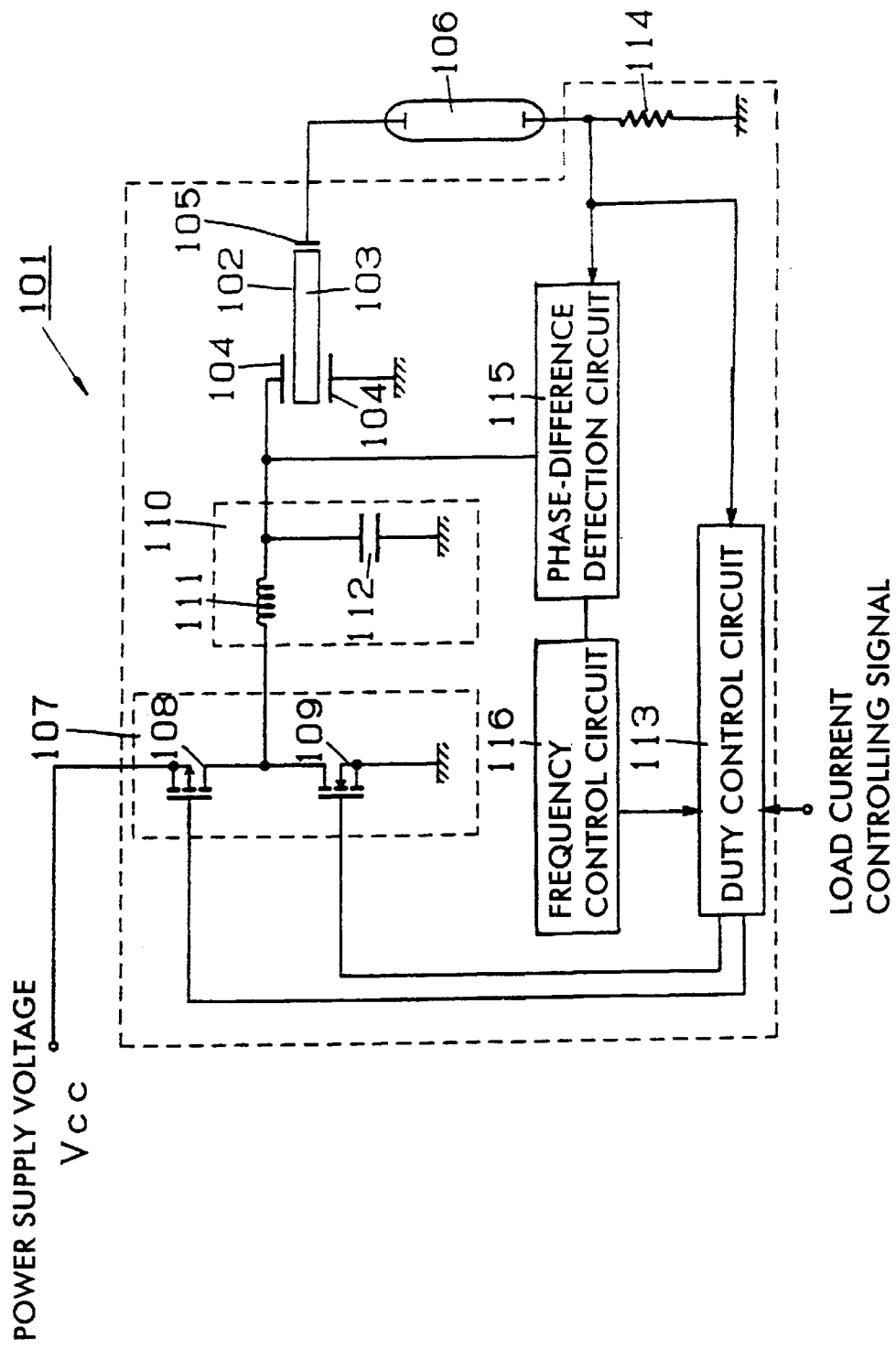
FIG. 13 is a circuit diagram showing a structure of a piezoelectric transformer inverter according to a first embodiment of the present invention.

FIG. 13 is a circuit diagram showing a structure of a piezoelectric transformer inverter 101 according to an embodiment of the present invention. A piezoelectric transformer 102 is a Rosen-type piezoelectric transformer, in which in a region of a piezoelectric substrate 103, a primary electrode 104 is disposed on both main surfaces of the piezoelectric substrate 103, which is polarized in a direction perpendicular to the primary electrodes 104, whereas in the other region of the piezoelectric substrate 103, a secondary electrode 105 is disposed on an end face of the piezoelectric substrate 103, which is polarized in a direction perpendicular to the secondary electrode 105. One of the primary electrodes 104 of the piezoelectric transformer 102 is grounded; and the piezoelectric transformer 102 performs voltage conversion of the alternating input voltage applied between the primary electrodes 104 to supply a load current to a load 106 connected to the secondary electrode 105.

A half-bridge drive circuit 107 is formed by two switching devices 108 and 109, and it is sometimes referred to as a push-pull circuit. In FIG. 13, as the two switching devices 108 and 109, a P-channel type FET (PchFET) and an N-channel type FET (NchFET) are used. However, other kinds of switching devices may be used. The mutual drains of the P-channel type FET (the switching device 108) of the upper arm and the N-channel type FET (the switching device 109) of the lower arm are connected to form the half-bridge drive circuit 107. In this arrangement, a power supply voltage $V_{CC}$ from a power supply such as a battery is supplied to the source of the P-channel type FET; the source of the N-channel type FET is grounded; and an output is extracted from a midpoint (drain) of both FETs.

An LC resonance circuit 110 is formed by the T-formed connection of a coil 111 and a capacitor 112, in which the coil 111 is connected between the output of the half-bridge drive circuit 107 and the non-grounded primary electrode 104 of the piezoelectric transformer 102, whereas the capacitor 112 is connected in parallel between the primary electrodes 104 of the piezoelectric transformer 102.

The output of a duty control circuit 113 is connected to the two switching devices 108 and 109 (the gates of the P-channel type FET and the N-channel type FET) forming the half-bridge drive circuit 107. The half-bridge drive circuit 107 switches on the switching device 108 of the upper arm and switches off the switching device 109 of the lower arm when the duty control circuit 113 is on, whereas when the duty control circuit 113 is off, the drive circuit 107 switches off the switching device 108 of the upper arm and switches on the switching device 109 of the lower arm. The duty control circuit 113 turns on/off at a specified ON-Duty to permit the switching devices 108 and 109 to be alternately switched on/off. Changing the ON-Duty of the duty control circuit 113, changes the timing of on/off of the half-bridge drive circuit 107, so that the driving frequency of the input voltage of the piezoelectric transformer 102 is controlled.

The voltage of a midpoint between the load 106 and the detection resistor 114 and load-current control signals from the outside are input to the duty control circuit 113. Since the voltage of the midpoint between the load 106 and the detection resistor 114 is proportional to a load-current value, this permits the duty control circuit 113 to detect the load-current value. The ON-Duty of the duty control circuit 113 changes according to load-current control signals from the outside, and controls in such a manner that the value of the current flowing into the load 106 is maintained to be a constant value according to the load-current control signals.

The load 106, such as a cold cathode tube, is connected to the detection resistor 114 in series, whereas the other end of the load 106 is connected to the secondary electrode 105 of the piezoelectric transformer 102, and the other end of the detection resistor 114 is grounded.

Figure 14:
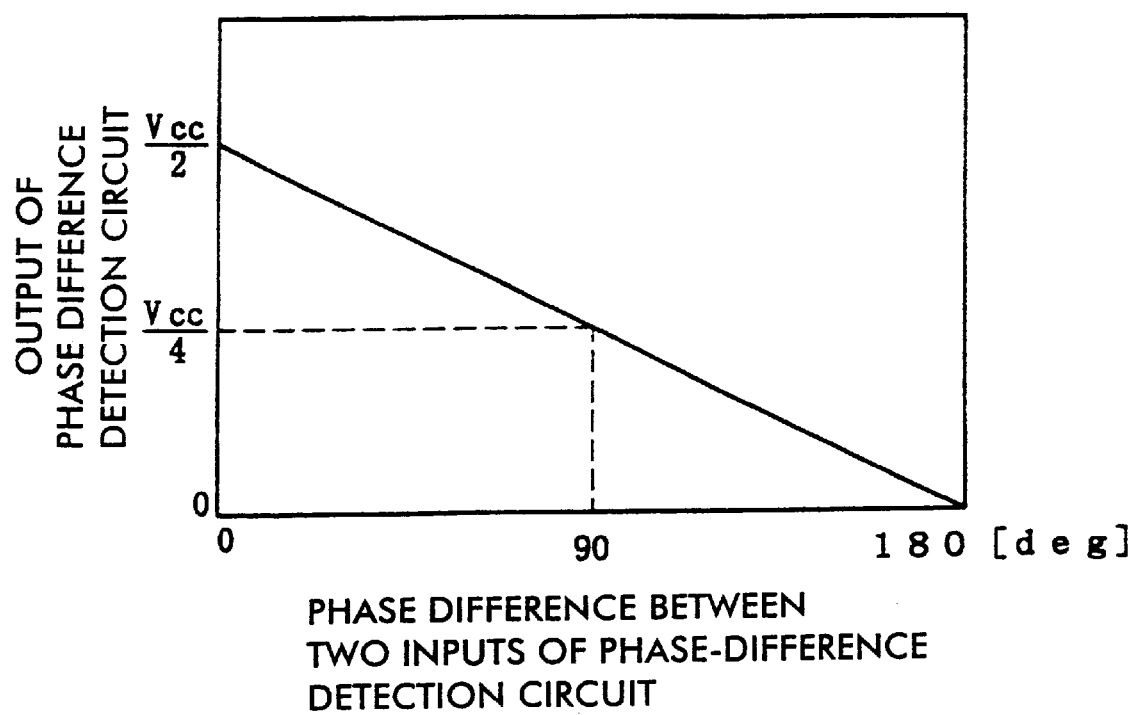
FIG. 14 is a graph showing the relationship between a phase difference in input voltage and output voltage of the piezoelectric transformer and output of a phase-difference detection circuit.

The phase-difference detection circuit 115 detects the input voltage and the output voltage (the voltage divided by the load 106 and the detection resistor 114) of the piezoelectric transformer 102, and converts the phase difference between the input voltage and the output voltage of the piezoelectric transformer 102 into a direct current output voltage. In other words, the phase-difference detection circuit 115 detects the phase difference between the input voltage and the output voltage of the piezoelectric transformer 102, and, as shown in FIG. 14, it changes the output voltage with respect to the phase difference in a linear-function form. Specifically, when the phase difference is 0°, a voltage of ½ of an input voltage $v_{CC}$ is output; when the phase difference is 90°, a voltage of $V_{CC}/4$ is output; and when the phase difference is 180°, no voltage is output.

The output of the phase-difference detection circuit 115 is input to the frequency control circuit 116, and the output of the frequency control circuit 116 is input to the duty control circuit 113. The frequency control circuit 116 permits the ON-Duty of the duty control circuit 113 to change according to the output from the phase-difference detection circuit 115, and controls the driving frequency of the half-bridge drive circuit 107 so that the phase difference between the input voltage and the output voltage of the piezoelectric transformer 102 detected by the phase-difference detection circuit 115 has a specified value.

Next, a description will be given of the operation of the piezoelectric transformer inverter 101. The half-bridge drive circuit 107 outputs rectangular waves of the input power-supply voltage $V_{CC}$ by switching on/off the two switching devices 108 and 109. The output of the half-bridge drive circuit 107 is input to the LC resonance circuit 110 including the coil 111 and the capacitor 112.

The LC resonance circuit 110 has the following two functions:

(1) It eliminates harmonic components contained in the rectangular-wave output of the half-bridge drive circuit 107 and improves the efficiency by allowing the input voltage of the piezoelectric transformer 102 to be close to a sine wave; and (2) it helps stepping up by the piezoelectric transformer 102 by the step-up operation of the LC resonance. In this case, a constant of the LC resonance circuit 110 is selected in such a manner that a resonance frequency $1/[2\pi\sqrt{(L_O C_O)}]$ of the LC resonance circuit 110 determined by the sum $C_O=C_P+C_C$ of the input capacity $C_P$ of the piezoelectric transformer 102 measured at a frequency sufficiently lower than a resonance frequency fr and the capacitance $C_C$ of the capacitor 112, and by the inductance $L_O$ of the coil 111, substantially coincides with a frequency fd of conversion efficiency peak.

The output of the LC resonance circuit 110 is input to the primary electrodes 104 of the piezoelectric transformer 102 and further is stepped up by the piezoelectric transformer 102. After that, it is supplied to the load 106 from the secondary electrode 105 of the piezoelectric transformer 102. The load current flowing into the load 106 is converted into voltage by the detection resistor 114 and rectified and smoothed in the duty control circuit 113 to be integrated and compared with the voltage of the load-current control signals input from the outside. When the load current is small, namely, when an integrated signal voltage is smaller than the load-current control signal voltage, the duty control circuit 113 increases the ON-Duty of the half-bridge drive circuit 107, and in contrast, when the load current is excessively large, it operates to make the ON-Duty of the half-bridge drive circuit 107 smaller. This operation of the duty control circuit 113 permits the load current to be controlled at a certain targeted value.

Meanwhile, the phase-difference detection circuit 115 compares the phase difference between the input voltage of the piezoelectric transformer 102 and the load current, and as shown in FIG. 14, outputs direct current voltage in accordance with the phase difference. Usually, since the load 106 such as a cold cathode tube can be regarded as a resistance load, detection of phase of a load current is equivalent to detection of phase of the output voltage of the piezoelectric transformer 102. Furthermore, the method for detecting the output of the piezoelectric transformer 102 may be used by disposing a voltage-divider resistor besides the load 106.

The frequency control circuit 116 controls an operating frequency so that the output of the phase-difference detection circuit 115 coincides with a predetermined targeted phase difference. In this case, the phase difference obtained when the operating frequency is equal to a frequency fd of conversion efficiency peak is set as a targeted phase difference, whereby the operating frequency is clamped on a frequency at the proximity of a bottom between the double humps in the frequency characteristics, namely, by a frequency fd of conversion efficiency peak. In practice, since there is an influence due to floating capacity or the like, it is difficult to predict how much the phase difference should be set to have the highest conversion efficiency. Thus, it is practical to adopt a method of finding the phase difference between the input/output voltages gained when the efficiency is highest, by changing the targeted phase difference at the initial period in designing the system. In the piezoelectric transformer inverter 101 of the present invention, there is an advantage in which the efficiency optimization can be facilitated simply by changing of the set value of a targeted phase difference.

In the case of performance of variable control of the load current, the phase difference between the input/output voltages whose efficiency is the highest according to each set current value, subtly differs. However, as used in back-lighting for a liquid-crystal display panel, in the application in which the changing range of load current is not wider than a few times as much, if a phase difference is adjusted so that the efficiency is the highest when load current is set at a substantially medium level, it is possible to sufficiently minimize efficiency reduction even when the load current is at minimum or maximum.

As described above, according to the piezoelectric transformer inverter 101, since the LC resonance circuit 110 is disposed between the output of the half-bridge drive circuit 107 and the primary electrodes 104 of the piezoelectric transformer 102, harmonic components contained in the output of the half-bridge drive circuit 107 can be blocked so as to drive the piezoelectric transformer 102 by substantial sine waves. Accordingly, losses associated with charging/ discharging of the piezoelectric-transformer input capacity can be substantially zero.

Constant control of the phase difference between the input voltage and the output voltage permits the driving frequency of the piezoelectric transformer inverter 101 to be fixed in the proximity of a certain frequency, whereby even when the frequency characteristics take the form of double humps by using the LC resonance circuit 110, the driving frequency can be fixed near a frequency fd of conversion efficiency peak, so that the piezoelectric transformer inverter 101 can be driven in a stable manner under the condition of the highest efficiency.

Furthermore, since the method of controlling the phase difference between the input voltage and the output voltage in a constant manner is used, the efficiency is more satisfactory than that in a method of detecting input current. In addition, achieving control by using analog control without using a microcomputer, the structure of the piezoelectric transformer inverter 101 can be simplified.

(Piezoelectric Transformer)

A detailed description will be given of the piezoelectric transformer 102. Preferably, a $\lambda/2$-mode Rosen-type piezoelectric transformer 102 is used as the piezoelectric transformer 102. The reason for that is described below.

In the characteristics of a cold cathode tube, when a lighting frequency is too low, the luminance characteristics of the cold cathode tube is deteriorated, whereas when the lighting frequency is too high, leak current due to floating capacity is increased and thereby the efficiency is lowered and non-uniformity of the luminance occurs. Thus, it is said that the most suitable driving frequency exists, in which about a few tens of kHz is the most desirable.

Figure 15A:
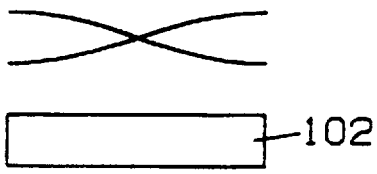
FIGS. 15(a), (b), and (c) are views showing the relationships between sizes of the piezoelectric transformer and piezoelectric resonance modes.
Figure 15B:
Figure 15C:
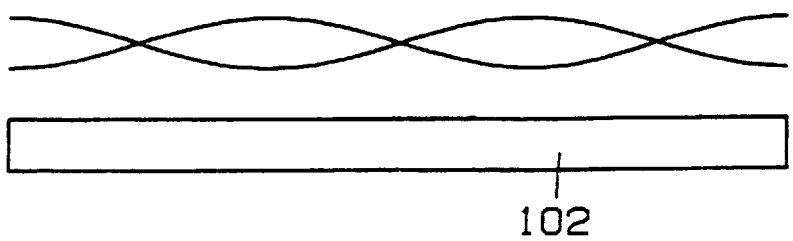

FIGS. 15(a), (b), and (c) respectively show the sizes of the piezoelectric transformer 102 of a $\lambda/2$ mode, a $\lambda$ mode, and a $3\lambda/2$ mode, respectively, when a driving frequency is fixed. As seen in the figure, the $\lambda/2$ mode piezoelectric transformer 102 can make the size smallest, so that it is suitable for miniaturization. However, in the $\lambda/2$ mode piezoelectric transformer 102, if a great amount of double harmonic component is contained in the input voltage, oscillation of the $\lambda$ mode is excited and distortion occurs in the output voltage, whereby it is difficult to control load current. Meanwhile, in the $\lambda$ mode, the double harmonic component is not excited in principle and is easily used, so that the $\lambda$ mode is usually often used.

However, in the piezoelectric transformer inverter 101 of the present invention, since the piezoelectric transformer 102 is driven by substantial sine waves filtered in the LC resonance circuit 110, not by rectangular waves, almost no double harmonic is contained. As a result, in the piezoelectric transformer inverter 101 of the present invention, a $\lambda/2$ mode Rosen-type piezoelectric transformer, which is easily miniaturized, can be applied, so that there is an advantage in making the piezoelectric transformer inverter 101 smaller.

As seen in FIG. 2, since the input impedance of the piezoelectric transformer 102 is close to a resistance component in the proximity of a frequency at the highest efficiency of the piezoelectric transformer 102, in order to obtain a sufficient filter operation, it is necessary to increase the capacitance of the outside capacitor 112 of the LC resonance circuit 110 to some extent.

(LC Resonance Circuit)

As the LC resonance circuit 110, the capacitor 112, which has capacitance $C_C$ not greater than four times the input capacity $C_P$ of the piezoelectric transformer 102, may be used; and preferably, a resonance frequency $1/[2\pi\sqrt{(L_O C_O)}]$ of the LC resonance circuit 110 determined by the sum of the capacitance $C_O = C_P + C_C$ and by the inductance $L_O$ of the coil 111 is set in a range of ±15% of a frequency fd of conversion efficiency peak.

Considering how the load resistance and the piezoelectric transformer 102 have been determined in the piezoelectric transformer inverter 101 as shown in FIG. 13, the magnitude of the resistance component of the piezoelectric-transformer input at a frequency fd of conversion efficiency peak is uniquely determined. In this case, if the capacitance $C_C$ of the capacitor 112 is increased and the inductance $L_O$ of the coil 111 is decreased, Q of the LC resonance can be set to be higher while a resonance frequency fr remains fixed. In other words, since the stepping-up operation of the LC resonance is increased, the step-up ratio of the piezoelectric transformer 102 can be small. In order to increase the step-up ratio of the piezoelectric transformer 102, although a method of forming a layered structure by the primary electrodes 104 is often adopted. The advantage of the present invention in which the step-up ratio can be small permits the number of layers to be decreased so as to reduce the production cost of the piezoelectric transformer 102.

However, it is actually impossible to infinitely increase the Q of the LC resonance. For instance, in a conventional embodiment (the eighth conventional embodiment) disclosed in Japanese Unexamined Patent Publication No. 9-51681, there is no description about a value of LC to be set, whereby it is difficult to practice the embodiment. In this embodiment, a practical designing of the piezoelectric transformer inverter 101 is possible by determining the magnitudes of the inductance $L_O$ of the coil 111 and the capacitance $C_C$ of the capacitor 112. A more detailed description of the embodiment will be given below.

Figure 16:
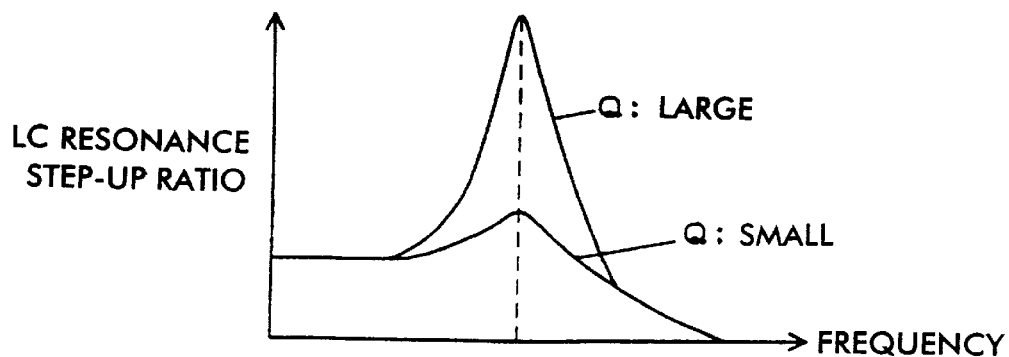
FIG. 16 is a graph showing a difference in the cases of a large Q and a small Q in the frequency characteristics of the step-up ratio of an LC resonance circuit.

FIG. 16 shows the frequency characteristics of a step-up ratio of the LC resonance circuit 110 (referred to as an LC resonance step-up ratio), obtained when Q of the LC resonance circuit 110 is set to be large (i.e., when the capacitance $C_C$ of the capacitor 112 is large, the inductance $L_O$ of the coil 111 is small), and when the Q is set to be small (i.e., when the capacitance $C_C$ of the capacitor 112 is small and the inductance $L_O$ of the coil 111 is large). In this case, in order to simplify the description, there will be provided an assumption that the piezoelectric transformer 102 has no stepping-up functions, and the input impedance of the piezoelectric transformer 102 is a pure capacitance $C_P$.

In FIG. 16, it can be seen that when the Q of the LC resonance circuit 110 is set to be large, the peak of the LC resonance step-up ratio is increased, whereas the frequency bandwidth capable of being stepped up is narrowed. In general, tolerances of the inductance of the coil 111 and the capacitance of the capacitor 112, which are on the market, are substantially ±20% in the inductance of the coil 111, and ±10% in the capacitance of the capacitor 112, respectively.

Assuming that the tolerance of the piezoelectric-transformer input capacity is also ±10%, the resonance frequency of the LC resonance circuit 110 (referred to as an LC resonance frequency) changes by v (1.2×1.1)=1.15 times as high at the maximum. That is, in terms of the selection of a constant of the LC resonance circuit 110, it is necessary that step-up ratio fluctuations by LC resonance do not occur at a practical level even if the LC resonance frequency varies by 15%.

However, the actual designing is difficult under the constraint in which the step-up ratio fluctuations by LC resonance do not occur at a practical level even if a resonance frequency of the LC resonance frequency varies by 15%. Consequently, there will be provided a consideration about determining the magnitudes of inductance of the coil 111 and capacitance of the capacitor 112. First, a definition is provided in which the meaning that "there is no fluctuation in a step-up ratio at a practical level," is equivalent to the one that "a step-up ratio fluctuation due to fluctuations in the LC resonance frequency is within −3 dB". The value −3 dB is a value used in defining a Q value and is practically a significant figure.

Figure 17:
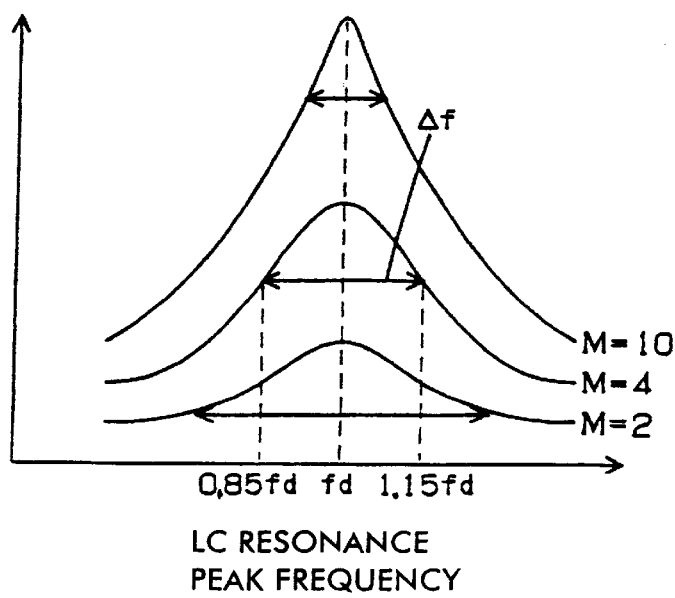
FIG. 17 is a graph showing the relationship between an LC resonance peak frequency and a step-up ratio in an efficiency maximum frequency fd obtained when a ratio M between a piezoelectric-transformer input capacity and a capacitor capacity is set as a parameter.

In the application in which a cold cathode tube is lit by using the Rosen-type piezoelectric transformer 102, the ratio $M=C_C/C_P$ of the piezoelectric-transformer input capacity $C_P$ and the capacitance $C_C$ of the outside capacitor 112 are used as a parameter. The state of the LC resonance step-up ratio obtained when the LC resonance frequency is changed by changing a value of the inductance $L_O$ of the coil 111 is shown in FIG. 17. The vertical axis in FIG. 17 indicates a step-up ratio in a frequency fd driven at the highest conversion efficiency, and f indicates −3 dB bandwidth in each M parameter. As seen in this figure, when M=4 is set, even if the LC resonance frequency deviates by 15% from a targeted frequency fd, reduction of the LC resonance step-up ratio is within about −3 dB. More specifically, although this result should change according to designing of the piezoelectric transformer 102 or the like, it is still applicable in the range of a practical designing parameter. In other words, it is possible to obtain a practical stepping-up operation by the LC resonance by using a capacitor having a capacitance $C_C$ not greater than four times the input capacity $C_P$ of the piezoelectric transformer as the outside capacitor 112 forming the LC resonance circuit 110 to set a resonance frequency $1/[2\pi\sqrt{(L_O C_O)}]$ of the LC resonance determined by the sum of both capacitance $C_O=C_P+C_C$ and by the inductance $L_O$ of the coil 111 in a range of ±15% of a frequency fd.

As described above, according to this embodiment, even when the inductance of the coil 111 and the capacitance of the capacitor 112 forming the LC resonance circuit 110 varies from a nominal value, the stepping-up operation of the LC resonance circuit 110 can be suppressed at a practical level, so that there is given a great effect on suppression of the characteristic variations of the piezoelectric transformer inverter 101.

(Phase-Difference Detection Circuit)

Figure 18:
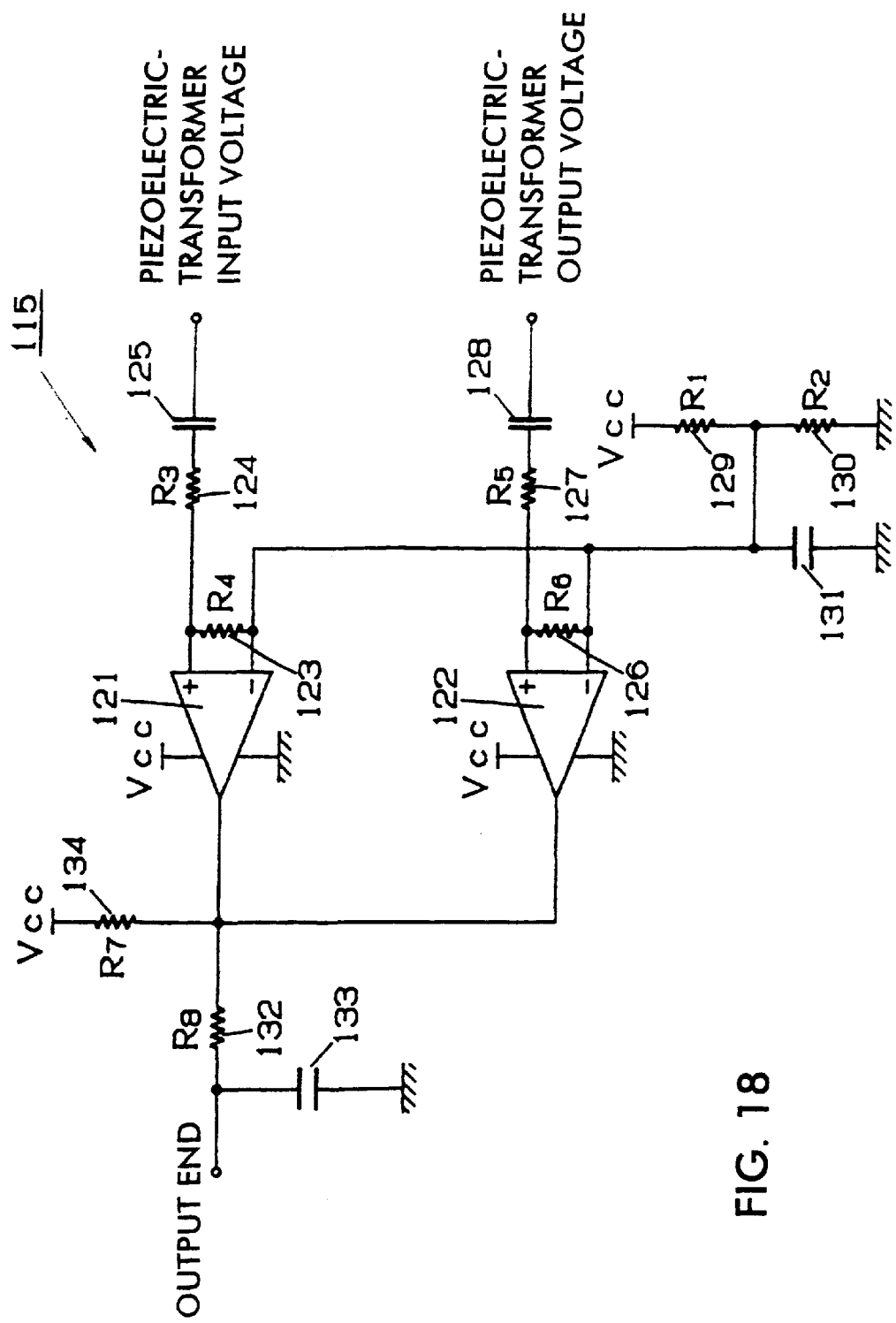
FIG. 18 is a detailed circuit diagram of a phase-difference detection circuit.

For the phase-difference detection circuit 115, it is possible to use one having a circuit structure as shown in FIG. 18. In the phase-difference detection circuit 115, two comparators 121 and 122 of an open-collector output type or an open-drain output type are used. A resistor 123 is connected between the non-inverting input terminal and the inverting input terminal of the comparator 121; and the non-inverting input terminal is connected to the primary electrodes 104 of the piezoelectric transformer 102 through a resistor 124 and a capacitor 125. A resistor 126 is connected between the non-inverting input terminal and the inverting input terminal of the other comparator 122; and the non-inverting input terminal is connected to a midpoint between the load 106 and the detection resistor 114 through a resistor 127 and a capacitor 128. Additionally, the voltage obtained by dividing a power-supply voltage $V_{CC}$ by voltage-divider resistors 129 and 130 is input to the inverting input terminals of the comparators 121 and 122, which are both connected to a ground through a capacitor 131. The output terminals of the comparators 121 and 122, which are mutually connected, are also connected to the output end of the phase-difference detection circuit 115 through a smoothing circuit formed by a resistor 132 and a capacitor 133 connected to a ground. Furthermore, the output terminals of the comparators 121 and 122 are connected to the power-supply voltage $V_{CC}$ through a pull-up resistor 134.

In the phase-difference detection circuit 115, inexpensive single-power-supply comparators are used as the comparators 121 and 122. Since comparison is impossible if the input voltage is negative in a single-power-supply comparator, the power-supply voltage $V_{CC}$ is divided by the resistors 129 and 130 in which resistance values R1 and R2 are equal to allow an input-terminal average voltage to be biased by $V_{CC}/2$. In addition, designing is conducted in such a manner that the input voltages of the comparators 121 and 122 stay within a range of 0 through $V_{CC}$, by appropriately selecting values R1 through R6 of the resistors 129, 130, 124, 123, 127, and 126.

In the phase-difference detection circuit 115, since the inverting input terminals of the comparators 121 and 122 are fixed at the level of $V_{CC}/2$, the outputs of the comparators 121 and 122 are high (H) during a period in which the non-inverting input terminals has voltage not smaller than $V_{CC}/2$. Since an average voltage of the non-inverting input terminals is $V_{CC}/2$, the comparator 121 produces high output during a period in which the input voltage of the piezoelectric transformer 102 is in a positive half-cycle, whereas the comparator 122 produces high output during a period in which the output voltage of the piezoelectric transformer 102 is in a positive half-cycle. In the case of the open-collector output type or the open-drain output type, the AND of both outputs is extracted simply by connecting both output terminals, so that smoothing of the AND output permits the piezoelectric-transformer input/output phase difference of 0° through 180° to be converted into direct current voltage. In this case, if the values of the resistors 134 and 132 are R7 and R8, when the piezoelectric-transformer input/output voltages have the same phase, the output voltage is $V_{CC}/2$, when the piezoelectric-transformer input/output voltages have an opposite phase, the output voltage is zero. Thus, this arrangement permits the phase-difference detection circuit 115 having the characteristics as shown in FIG. 14 to be formed. In addition, the characteristics shown in FIG. 14 may be reversed according to the characteristics of a back-stage circuit, and the output voltage may be zero when the piezoelectric-transformer input/output voltages have the same phase.

In general, it is possible to obtain a comparator IC including two circuits at an extremely low price. Furthermore, when a comparator of an open-collector output type or an open-drain output type is used as the comparator, it is possible to automatically obtain AND by connecting the output terminals for a common use and thereby an additional logic IC is not necessary. Accordingly, in the phase-difference detection circuit 115 of the structure shown in FIG. 18, the phase-difference detection circuit 115 can be obtained at a low price, whereby there is a great effect on suppression of production cost of the piezoelectric transformer inverter 101.

(Second Embodiment)

Figure 19:
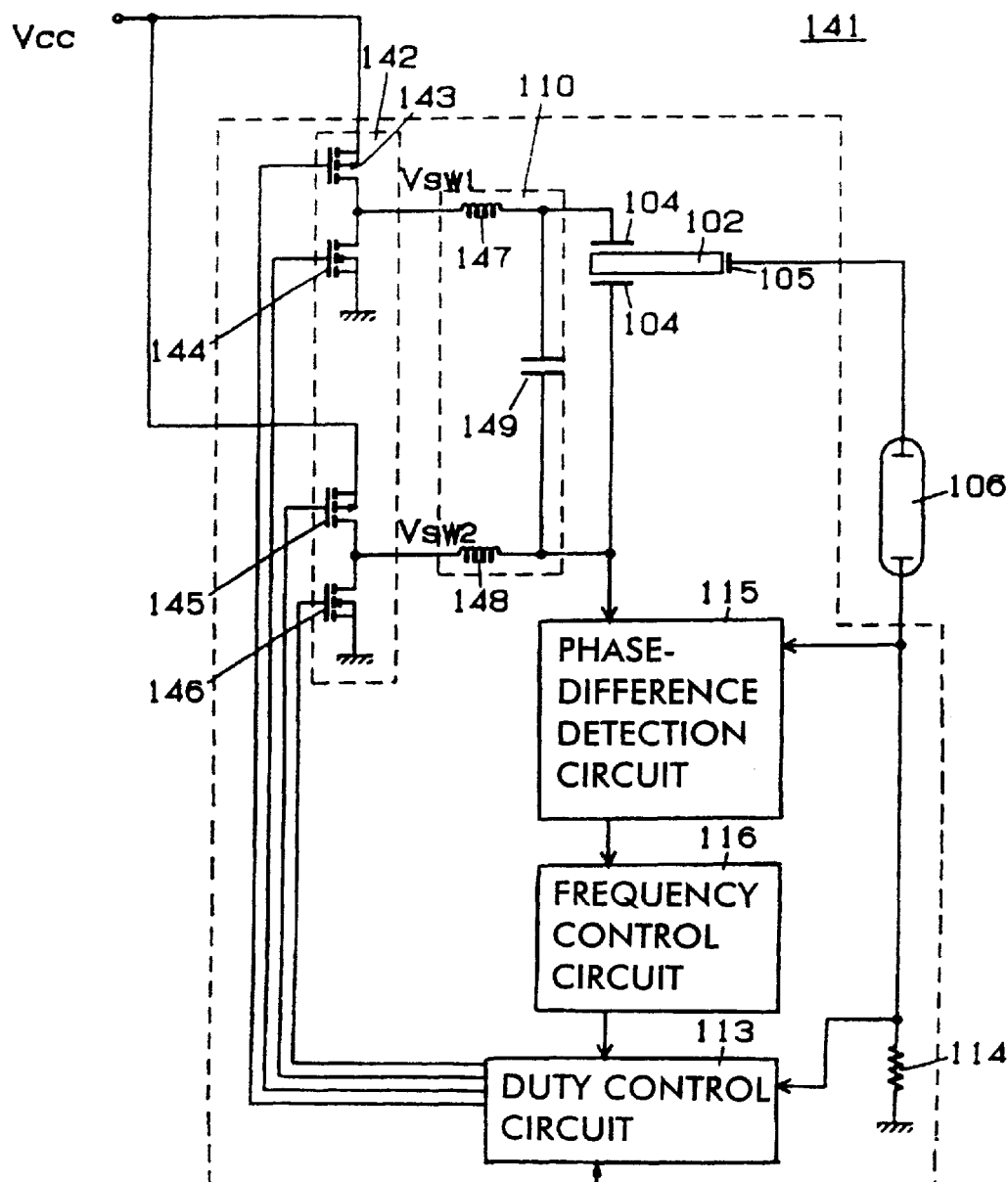
FIG. 19 is a circuit diagram showing a structure of a piezoelectric transformer inverter according to a second embodiment of the present invention.

FIG. 19 is a circuit diagram showing a structure of a piezoelectric transformer inverter 141 according to another embodiment of the present invention. In the piezoelectric transformer inverter 141, the primary electrodes 104 of the piezoelectric transformer 102 are both allowed to be floating with respect to ground, and instead of using a half-bridge drive circuit, a full-bridge drive circuit 142 is used as a drive circuit. The full-bridge drive circuit 142 is composed of four switching devices. In the embodiment shown in FIG. 19, as the four switching devices, two P-channel type FETs 143 and 145, and two N-channel type FETs 144 and 146 are used, but other kinds of switching devices may be applicable. A series-connection unit of the P-channel type FET 143 and the N-channel type FET 144, and the series-connection unit of the P-channel type FET 145 and the N-channel type FET 146, are disposed in parallel. In other words, the drains of the P-channel type FETs 143 and 145 of the upper arm and the drains of the N-channel type FETs 144 and 146 of the lower arm are mutually connected, in which a power-supply voltage $V_{CC}$ from a power supply such as a battery is supplied to the sources of the P-channel type FETs 143 and 145, whereas the sources of the N-channel type FETs 144 and 146 are connected to a ground.

Four outputs are extended from the duty control circuit 113 to be connected to the gates of the respective FETs 143, 144, 145, and 146. The output from a midpoint (drain) between the P-channel type FET 143 and the N-channel type FET 144 is attached to one of the primary electrodes 104 through a coil 147, whereas the output from a midpoint (drain) between the P-channel type FET 145 and the N-channel type FET 146 is attached to the other primary electrode 104 through a coil 148.

The capacitor 149 is connected in parallel to the primary side of the piezoelectric transformer 102 between the primary electrodes 104 of the piezoelectric transformer 102, in which the LC resonance circuit 110 is formed by two coils 147 and 148, and a capacitor 149. The inductance of the coils 147 and 148 is such that the required inductance obtained by the calculated result of LC resonance frequency is equivalent to the series-combined inductance of both coils 147 and 148. In this case, the values of the inductance of both coils 147 and 148 are preferably equal.

In this embodiment, the drive circuit 142 of the piezoelectric transformer inverter 141 has a full-bridge structure, in which a power-supply voltage $V_{CC}$ is applied alternately to the primary electrodes 104, whereby the input voltage applied to the piezoelectric transformer 102 can be twice as much. As a result, a required step-up ratio of the piezoelectric transformer 102 can be small and thereby the workload on the piezoelectric transformer 102 can be reduced. Accordingly, the number of layers on the primary side of the piezoelectric transformer 102 can be decreased so as to suppress the production cost of the piezoelectric transformer 102.

Figure 20A:
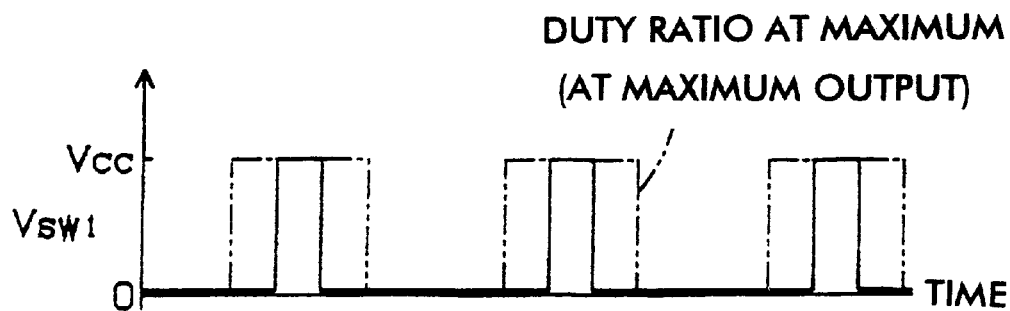
FIG. 20 shows charts of examples of a driving signal waveform of a full-bridge drive circuit in the piezoelectric transformer inverter above.
Figure 20B:

Additionally, each ON-Duty of the output $V_{SW1}$ from a midpoint between the P-channel type FET 143 and the N-channel type FET 144 and the output $V_{SW2}$ from a midpoint between the other P-channel type FET 145 and the other N-channel type FET 146 is set to be an equivalent duty as shown in FIGS. 20(a) and (b), respectively, (in which the pulse widths of the output $V_{SW1}$ and the output $V_{SW2}$ are set to be equivalent), and the phase difference is set to be 180°, so that double harmonic contained in the piezoelectric-transformer input voltage can be lower than that in the case of a half bridge. Thus, even in the case in which a $\lambda/2$-mode Rosen-type piezoelectric transformer is used, the distortion component of the output voltage waveform can be smaller.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric transformer inverter comprising:
    a piezoelectric transformer having a pair of primary electrodes, one of which primary electrodes is grounded, which performs voltage conversion of an alternating input voltage or a direct current input voltage applied between the primary electrodes to supply an output voltage to a load connected to a secondary electrode of the piezoelectric transformer;
    a drive unit for supplying the alternating input voltage or the direct current input voltage between the primary electrodes of the piezoelectric transformer;
    a low-pass type resonance circuit unit inserted between an output of the drive unit and the primary electrodes of the piezoelectric transformer;
    a duty control unit for controlling an ON-Duty of the drive unit so that a value of a current flowing into the load coincides with a targeted current value;
    a phase-difference detection unit for detecting a phase difference between the input voltage and the output voltage of the piezoelectric transformer; and
    a frequency control unit for controlling a driving frequency of the drive unit so as to give the phase difference a specified value.

2. The piezoelectric transformer inverter according to claim 1, wherein the phase-difference detection unit has two comparators, whose output terminals are mutually AND-connected using an open-collector output type or an open-drain output type.

3. The piezoelectric transformer inverter according to claim 1, wherein a Rosen-type piezoelectric transformer of $\lambda/2$ mode is used as the piezoelectric transformer.

4. The piezoelectric transformer inverter according to claim 1, wherein the drive unit is a half-bridge circuit.

5. The piezoelectric transformer inverter of claim 1, wherein the low-pass resonance circuit includes a coil and a capacitor.

6. The piezoelectric transformer inverter of claim 5, wherein the coil is connected between the output of the drive unit and one of the primary electrodes of the piezoelectric transformer and the capacitor is connected in parallel between the primary electrodes.

7. The piezoelectric transformer inverter of claim 6, wherein the capacitor has a capacitance not larger than four times the value of an input capacity of the piezoelectric transformer measured at a frequency lower than a resonance frequency of the piezoelectric transformer.

8. The piezoelectric transformer inverter of claim 1, wherein the resonance frequency determined by a combined capacitance, which is the sum of the capacitance of the capacitor and the piezoelectric-transformer input capacitance, and the inductance of the coil, is set in a range of ±15% of the driving frequency.

9. A piezoelectric transformer inverter comprising:
    a piezoelectric transformer having primary electrodes for performing voltage conversion of an alternating input voltage or a direct current voltage applied between the primary electrodes to supply an output voltage to a load connected to a secondary electrode;
    a drive unit for supplying the alternating input voltage or the direct current input voltage separately to the two primary electrodes of the piezoelectric transformer;

a low-pass type resonance circuit unit inserted between an output of the drive unit and the primary electrodes of the piezoelectric transformer;

a duty control unit for controlling the ON-Duty of the drive unit so that a value of current flowing into the load coincides with a targeted current value;

a phase-difference detection unit for detecting a phase difference between the input voltage and the output voltage of the piezoelectric transformer; and a frequency control unit for controlling a driving frequency of the drive unit so as to give the phase difference a specified value.

10. The piezoelectric transformer inverter according to claim 9, wherein the phase-difference detection unit has two comparators, whose output terminals are mutually AND-connected using an open-collector output type or an open-drain output type.

11. The piezoelectric transformer inverter according to claim 9, wherein a Rosen-type piezoelectric transformer of λ/2 mode is used as the piezoelectric transformer.

12. The piezoelectric transformer inverter according to claim 9, wherein the drive unit is a full-bridge circuit.

13. The piezoelectric transformer inverter of claim 9, wherein the low-pass resonance circuit includes a coil and a capacitor.

14. The piezoelectric transformer inverter of claim 10, wherein the coil is connected between the output of the drive unit and one of the primary electrodes of the piezoelectric transformer and the capacitor is connected in parallel between the primary electrodes.

15. The piezoelectric transformer inverter of claim 13, wherein the capacitor has a capacitance not larger than four times the value of an input capacity of the piezoelectric transformer measured at a frequency lower than a resonance frequency of the piezoelectric transformer.

16. The piezoelectric transformer inverter of claim 9, wherein the resonance frequency determined by a combined capacitance, which is the sum of the capacitance of the capacitor and the piezoelectric-transformer input capacitance, and the inductance of the coil, is set in a range of ±15% of the driving frequency.

* * * * *